(12) United States Patent
Namgung et al.

(10) Patent No.: US 9,758,612 B2
(45) Date of Patent: Sep. 12, 2017

(54) POLYMER, ORGANIC LAYER COMPOSITION, ORGANIC LAYER, AND METHOD OF FORMING PATTERNS

(71) Applicant: SAMSUNG SDI CO., LTD., Yongin-si, Gyeonggi-do (KR)

(72) Inventors: Ran Namgung, Suwon-si (KR); Hyo-Young Kwon, Suwon-si (KR); Seung-Hyun Kim, Suwon-si (KR); Dominea Rathwell, Suwon-si (KR); Soo-Hyoun Mun, Suwon-si (KR); Hyeon-Il Jung, Suwon-si (KR); Yu-Mi Heo, Suwon-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/931,243

(22) Filed: Nov. 3, 2015

(65) Prior Publication Data
US 2016/0237195 A1   Aug. 18, 2016

(30) Foreign Application Priority Data
Feb. 17, 2015   (KR) .......................... 10-2015-0024474

(51) Int. Cl.
| | | |
|---|---|---|
| *C08G 12/00* | (2006.01) | |
| *C08G 12/26* | (2006.01) | |
| *C08G 61/12* | (2006.01) | |
| *G03F 7/09* | (2006.01) | |
| *G03F 7/11* | (2006.01) | |
| *G03F 7/16* | (2006.01) | |
| *G03F 7/26* | (2006.01) | |
| *C08G 73/06* | (2006.01) | |
| *G03F 7/075* | (2006.01) | |
| *H01L 21/027* | (2006.01) | |

(52) U.S. Cl.
CPC ............ *C08G 12/00* (2013.01); *C08G 12/26* (2013.01); *C08G 61/124* (2013.01); *C08G 73/0672* (2013.01); *G03F 7/094* (2013.01); *C08G 2261/148* (2013.01); *C08G 2261/1424* (2013.01); *C08G 2261/314* (2013.01); *C08G 2261/3241* (2013.01); *C08G 2261/3424* (2013.01); *G03F 7/0752* (2013.01); *H01L 21/0271* (2013.01)

(58) Field of Classification Search
CPC ...... C08G 12/00; C08G 61/124; C08G 12/26; G03F 7/11; G03F 7/168; G03F 7/162; G03F 7/091; G03F 7/26; H01L 21/0271
See application file for complete search history.

(56) References Cited

U.S. PATENT DOCUMENTS

| | | | | |
|---|---|---|---|---|
| 2012/0077345 A1* | 3/2012 | Saito | ...................... | C08G 12/26 438/703 |
| 2013/0122710 A1* | 5/2013 | Saito | ...................... | C08G 12/26 438/703 |
| 2013/0280913 A1* | 10/2013 | Shinjo | .................. | C09D 139/04 438/694 |
| 2014/0235059 A1* | 8/2014 | Sakamoto | .............. | C08G 12/08 438/702 |
| 2014/0235060 A1* | 8/2014 | Shinjo | ....................... | G03F 7/11 438/703 |
| 2015/0004531 A1* | 1/2015 | Choi | ........................ | G03F 7/091 430/5 |
| 2015/0011092 A1* | 1/2015 | Someya | ................. | C08G 73/06 438/703 |
| 2015/0017791 A1* | 1/2015 | Ohashi | ................... | C08L 101/00 438/514 |
| 2015/0044876 A1* | 2/2015 | Nishimaki | .............. | G03F 7/091 438/703 |
| 2015/0248057 A1* | 9/2015 | Ohnishi | .................. | G03F 7/091 430/319 |
| 2015/0329718 A1* | 11/2015 | Choi | .................. | H01L 21/31144 216/47 |
| 2016/0090449 A1* | 3/2016 | Nam | ................... | C08G 73/0672 438/703 |
| 2016/0152771 A1* | 6/2016 | Mun | .................. | C08G 73/0672 438/703 |
| 2016/0322216 A1* | 11/2016 | Mun | ........................ | C08G 8/04 |

FOREIGN PATENT DOCUMENTS

| | | |
|---|---|---|
| JP | 4355643 B2 | 11/2009 |
| JP | 2014-029435 A | 2/2014 |
| KR | 10-2012-0038447 A | 4/2012 |
| KR | 10-2013-0130005 A | 11/2013 |
| TW | 201120075 A1 | 6/2011 |

(Continued)

OTHER PUBLICATIONS

English translation of JP, 2014-029435, A (1994) from machine translation from AIPN Japan Patent Office National Center for Industrial Property Information and Training, generated Aug. 6, 2014, 24 pages.*

(Continued)

*Primary Examiner* — Cynthia Hamilton

(74) *Attorney, Agent, or Firm* — Lee & Morse, P.C.

(57) ABSTRACT

A polymer, an organic layer composition, an organic layer, and a method of forming patterns, the polymer including a moiety represented by the following Chemical Formula 1:

[Chemical Formula 1]

$$*-\!\!-\!\!A^1\!\!-\!\!A^3\!\!+\!\!A^2\!\!-\!\!A^4\tfrac{}{}_m\!\!-\!\!*\cdot$$

22 Claims, No Drawings

(56) References Cited

FOREIGN PATENT DOCUMENTS

| TW | 201407290 A | 2/2014 |
|---|---|---|
| TW | 201500843 A | 1/2015 |
| WO | WO 2010/147155 A1 | 12/2010 |
| WO | WO 2012/077640 A1 | 6/2012 |
| WO | WO 2013/005797 A1 | 1/2013 |
| WO | WO 2013/047516 A1 | 4/2013 |
| WO | WO 2013/115097 A1 | 8/2013 |
| WO | WO 2013/146670 A1 | 10/2013 |
| WO | WO 2014/038483 A1 * | 3/2014 |

OTHER PUBLICATIONS

Kondo et al "Functions monomers and polymers, 144: Synthesis and polymerization of monomers containing the coronene moiety", Makromol. Chem., Rapid Commun. 7, 549-551 (1986).*
Foreign Priority application KR 10-2015-0133998 having filing date of Sep. 22, 2015 obtained from U.S. Appl. No. 15/062,233 (US preblication of 2016/0322216 a1). 60 pages.*
Translation of Foreign Priority application KR 10-2015-0133998 having filing date of Sep. 22, 2015 and obtained from USPTO cross files of this application in file for publication KR20160129677, 23 pages.*
Taiwanese Search Report dated Oct. 6, 2016 for corresponding Taiwanese Patent Application No. 104137423; Ran Namgung, et al.

* cited by examiner

POLYMER, ORGANIC LAYER COMPOSITION, ORGANIC LAYER, AND METHOD OF FORMING PATTERNS

CROSS-REFERENCE TO RELATED APPLICATION

Korean Patent Application No. 10-2015-0024474, filed on Feb. 17, 2015, in the Korean Intellectual Property Office, and entitled: "Polymer, Organic Layer Composition, Organic Layer, and Method of Forming Patterns," is incorporated by reference herein in its entirety.

BACKGROUND

1. Field

Embodiments relate to a polymer, an organic layer composition, an organic layer, and a method of forming patterns using the organic layer composition.

2. Description of the Related Art

The semiconductor industry has considered an ultra-fine technique having a pattern of several to several tens nanometer size. Such ultrafine techniques utilize effective lithographic techniques. Some lithographic techniques may include providing a material layer on a semiconductor substrate; coating a photoresist layer thereon; exposing and developing the same to provide a photoresist pattern; and etching the material layer using the photoresist pattern as a mask.

SUMMARY

Embodiments are directed to a polymer, an organic layer composition, an organic layer, and a method of forming patterns using the organic layer composition.

The embodiments may be realized by providing a polymer including a moiety represented by Chemical Formula 1:

[Chemical Formula 1]

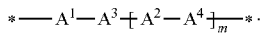

wherein, in Chemical Formula 1, * is a linking point to a neighboring atom, m is 0 or 1, $A^1$ and $A^2$ are each independently a divalent group including one of the following moieties,

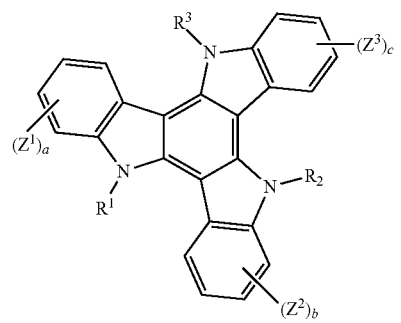

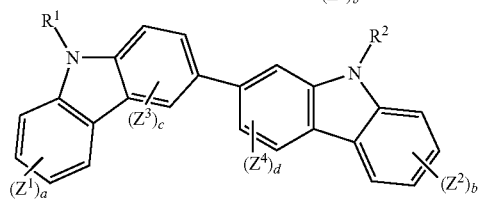

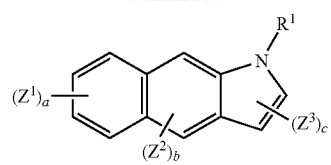

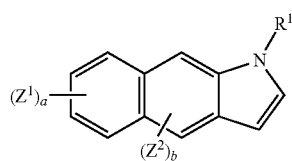

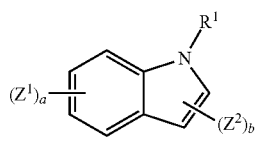

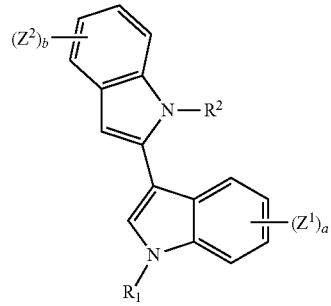

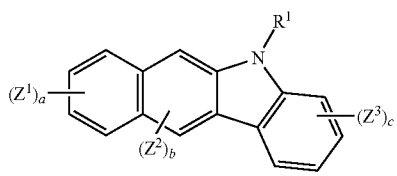

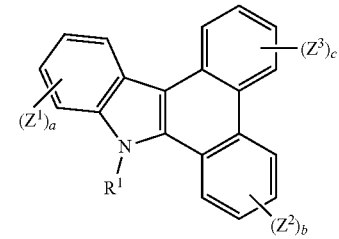

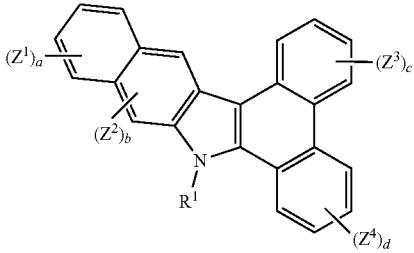

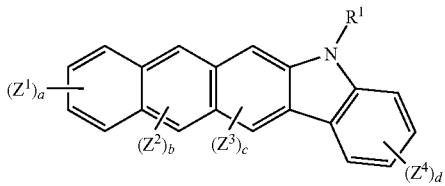

-continued
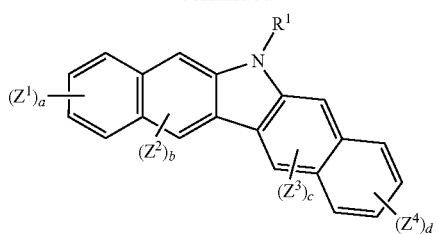
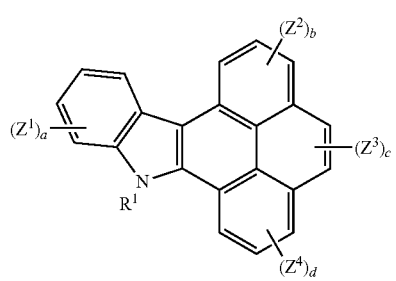
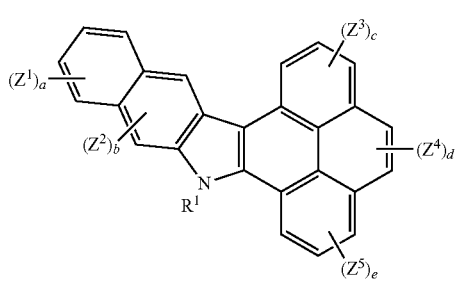
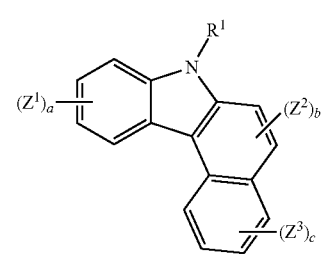
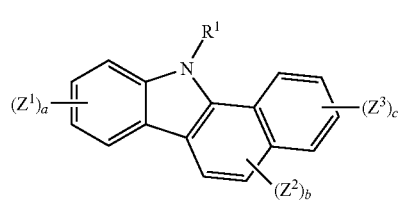
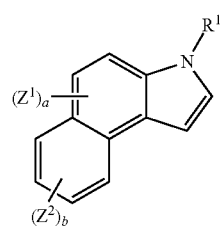
-continued
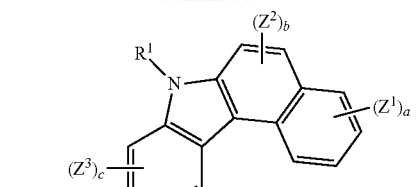
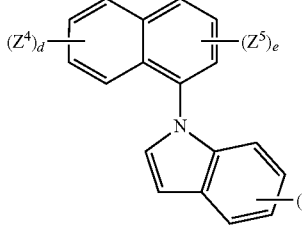
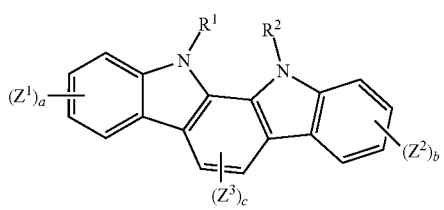
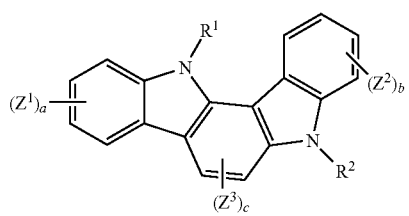
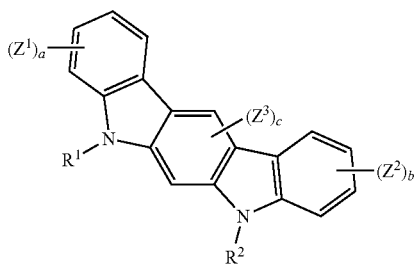
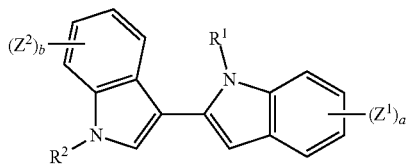
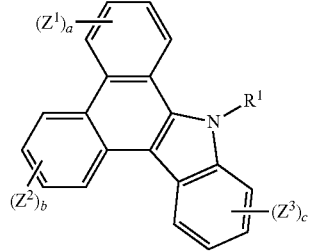

-continued

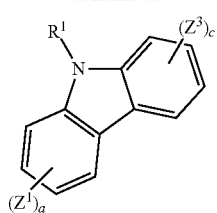

wherein, in the above compounds, $R^1$, $R^2$ and $R^3$ are each independently hydrogen, a hydroxy group, a methoxy group, an ethoxy group, a halogen, a substituted or unsubstituted C6 to C30 aryl group, or a combination thereof, $Z^1$ to $Z^6$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and a, b, c, d, e, and f are each independently an integer of 0 to 2, $A^3$ and $A^4$ are each independently a divalent group represented by Chemical Formula 2 or Chemical Formula 3, below,

[Chemical Formula 2]

[Chemical Formula 3]

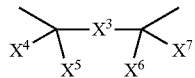

wherein, in Chemical Formula 2, $X^1$ and $X^2$ are each independently hydrogen or a substituted or unsubstituted C6 to C30 aryl group, and at least one of $X^1$ and $X^2$ is a substituted or unsubstituted C6 to C30 aryl group, wherein, in Chemical Formula 3, $X^3$ is a substituted or unsubstituted C6 to C30 arylene group, and $X^4$ to $X^7$ are each independently a substituted or unsubstituted C6 to C30 aryl group.

In Chemical Formulae 2 and 3, the C6 to C30 aryl group may be a monovalent group including one of the following moieties:

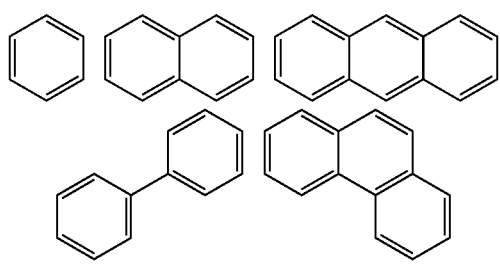

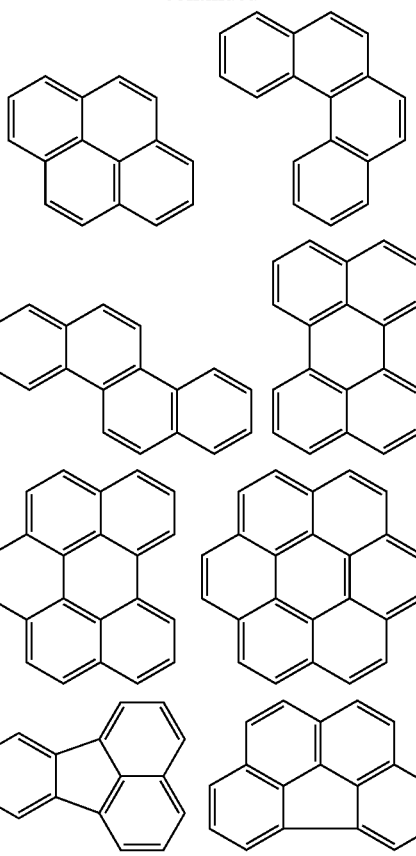

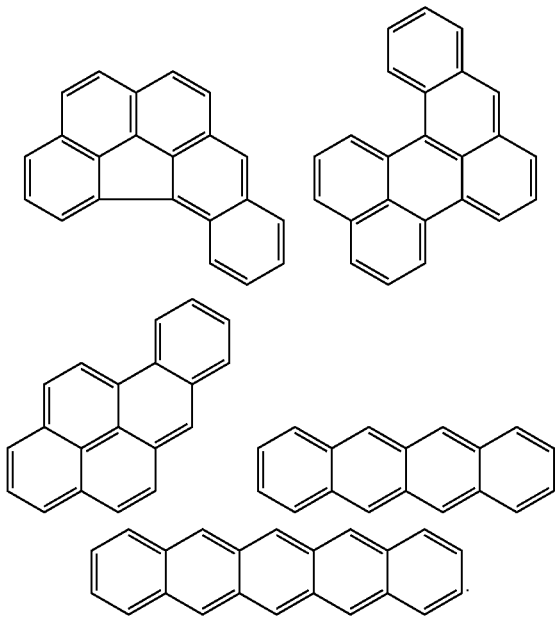

In Chemical Formula 3, the C6 to C30 arylene group may be a divalent group including one of the following moieties:

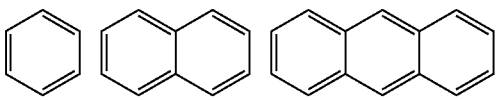

-continued

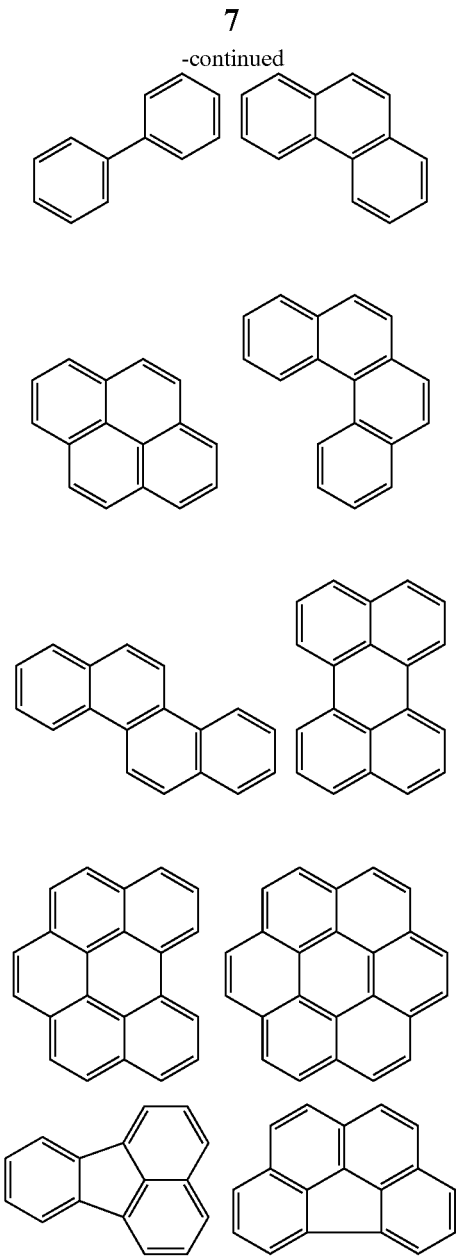

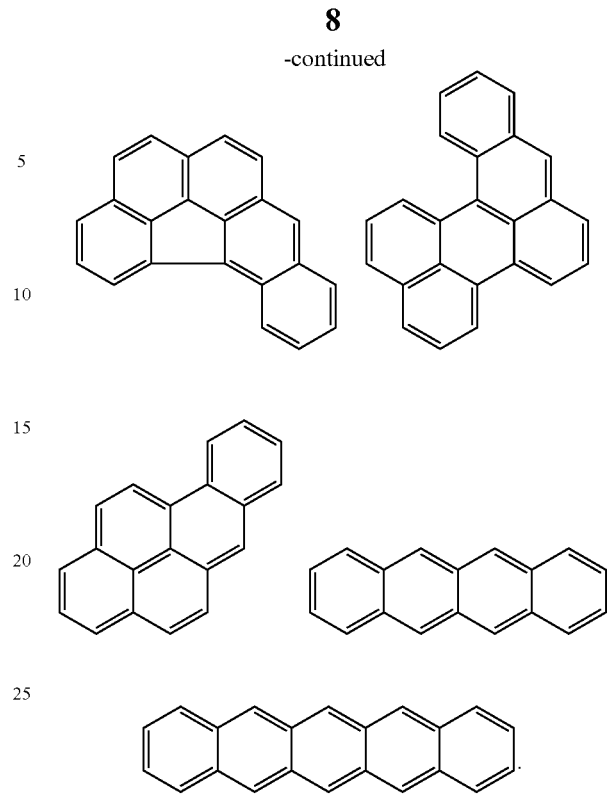

In Chemical Formula 2, at least one of $X^1$ and $X^2$ may be a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof.

In Chemical Formula 3, at least one of $X^3$ to $X^7$ may be a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof.

The polymer may include a moiety represented by one of the following Chemical Formulae 1-1 to 1-4:

[Chemical Formula 1-1]

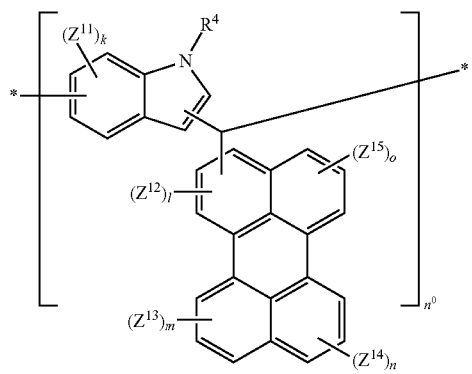

[Chemical Formula 1-2]

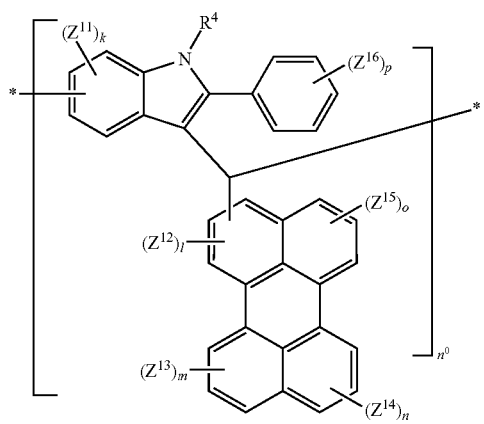

-continued

[Chemical Formula 1-3]

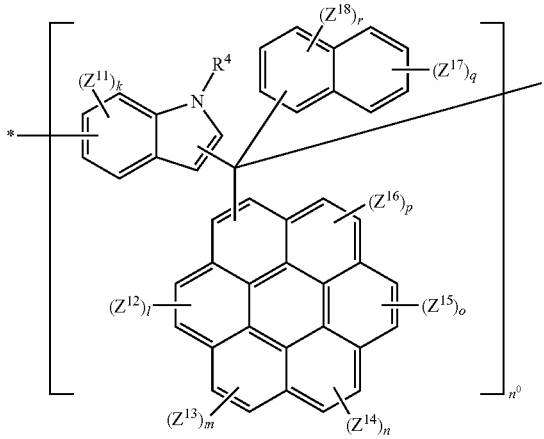

[Chemical Formula 1-4]

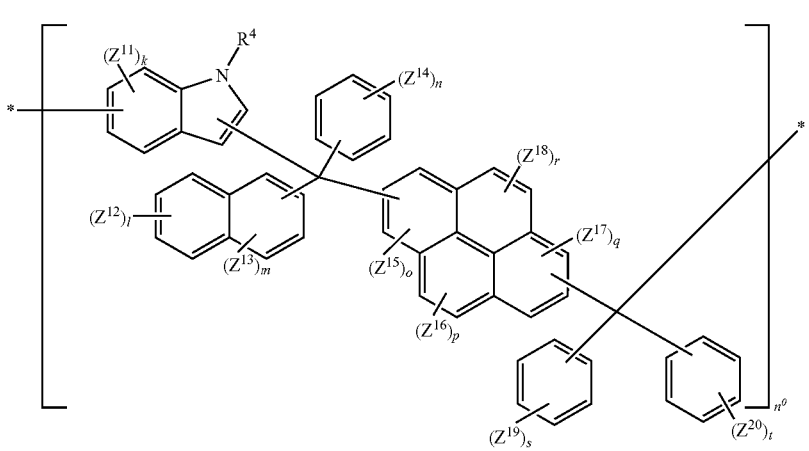

wherein, in Chemical Formulae 1-1 to 1-4, $R^4$ may be hydrogen, a hydroxy group, a halogen, a substituted or unsubstituted C6 to C30 aryl group, or a combination thereof, $Z^{11}$ to $Z^{20}$ may each independently be a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, k, l, m, n, o, p, q, r, s, and t may each independently be an integer of 0 to 2, n° may be an integer of 2 to 300, and * is a linking point to a neighboring atom.

The polymer may have a weight average molecular weight of about 1,000 to about 200,000.

The embodiments may be realized by providing an organic layer composition including a solvent; and a polymer including a moiety represented by the following Chemical Formula 1,

[Chemical Formula 1]

$$*-A^1-A^3+A^2-A^4\}_m-*$$

wherein, in Chemical Formula 1, * is a linking point to a neighboring atom, m is 0 or 1, $A^1$ and $A^2$ are each independently a divalent group including one of the following moieties,

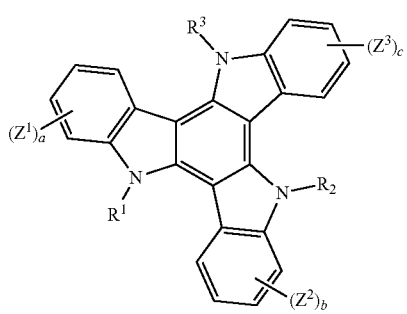

-continued
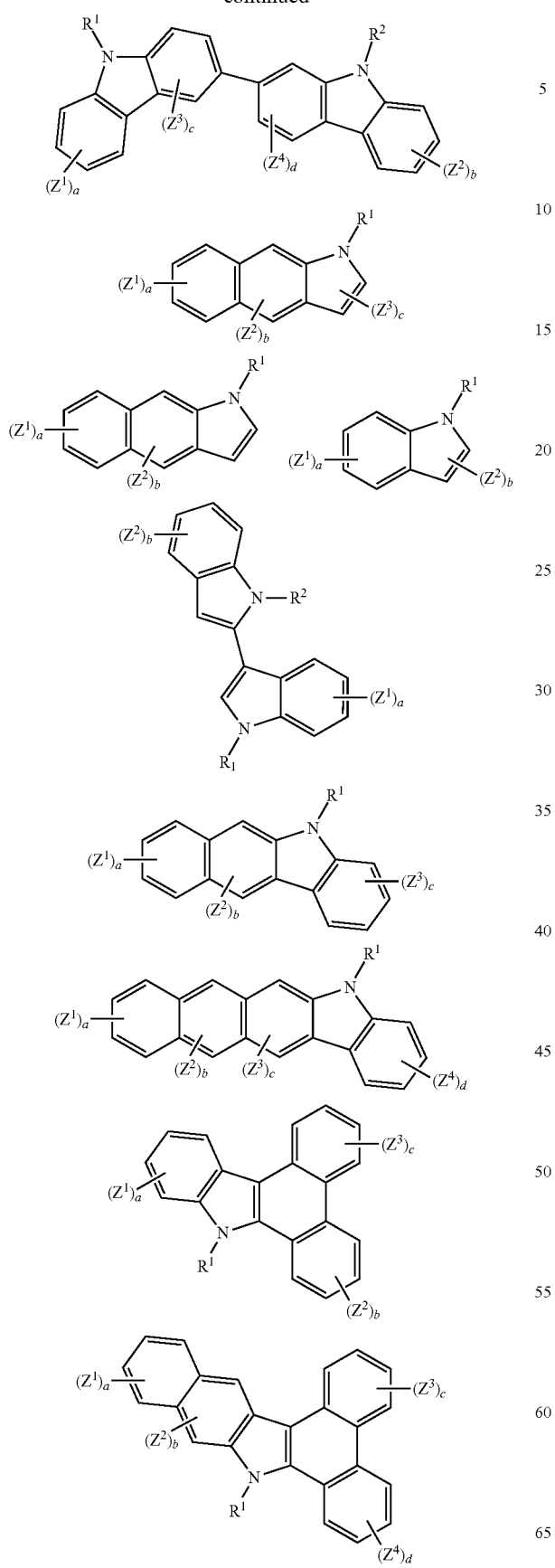
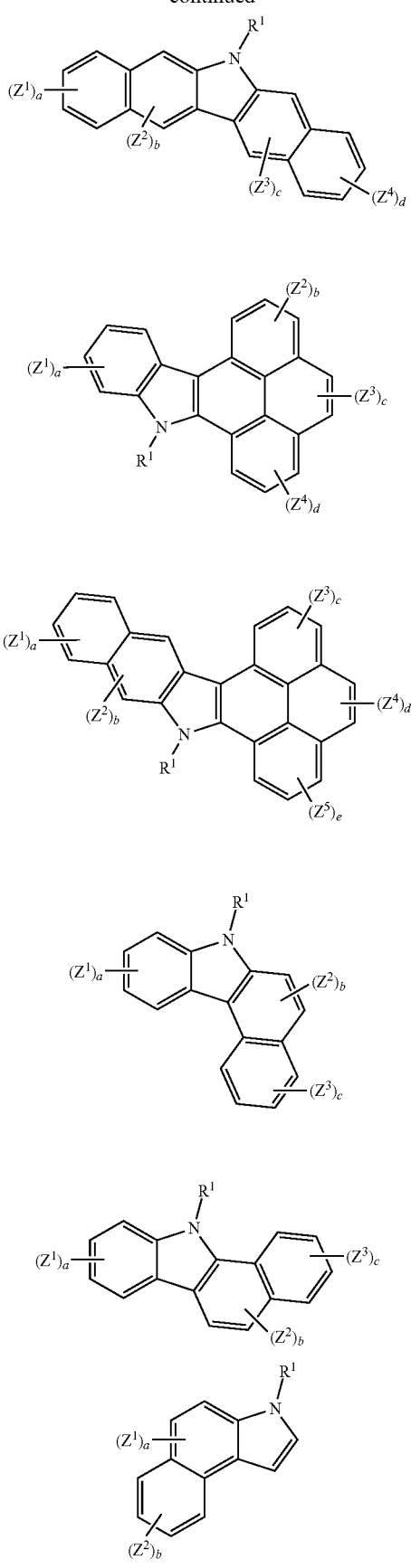

-continued

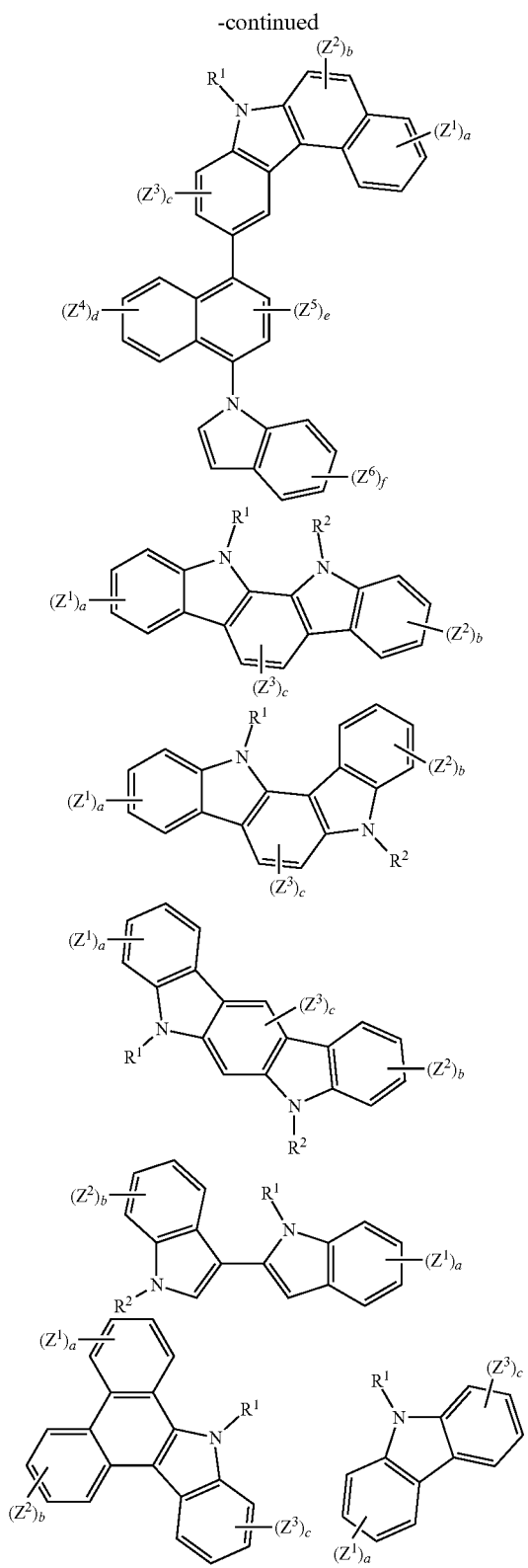

wherein, in the above compounds, R¹, R² and R³ are each independently hydrogen, a hydroxy group, a methoxy group, an ethoxy group, a halogen, a substituted or unsubstituted C6 to C30 aryl group, or a combination thereof, $Z^1$ to $Z^6$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and a, b, c, d, e, and f are each independently an integer of 0 to 2, $A^3$ and $A^4$ are each independently a divalent group represented by Chemical Formula 2 or Chemical Formula 3, below,

[Chemical Formula 2]

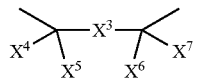

[Chemical Formula 3]

wherein, in Chemical Formula 2, $X^1$ and $X^2$ are each independently hydrogen or a substituted or unsubstituted C6 to C30 aryl group, and at least one of $X^1$ and $X^2$ is a substituted or unsubstituted C6 to C30 aryl group, wherein, in Chemical Formula 3, $X^3$ is a substituted or unsubstituted C6 to C30 arylene group, and $X^4$ to $X^7$ are each independently a substituted or unsubstituted C6 to C30 aryl group.

In Chemical Formulae 2 and 3, the C6 to C30 aryl group may be a monovalent group including one of the following moieties:

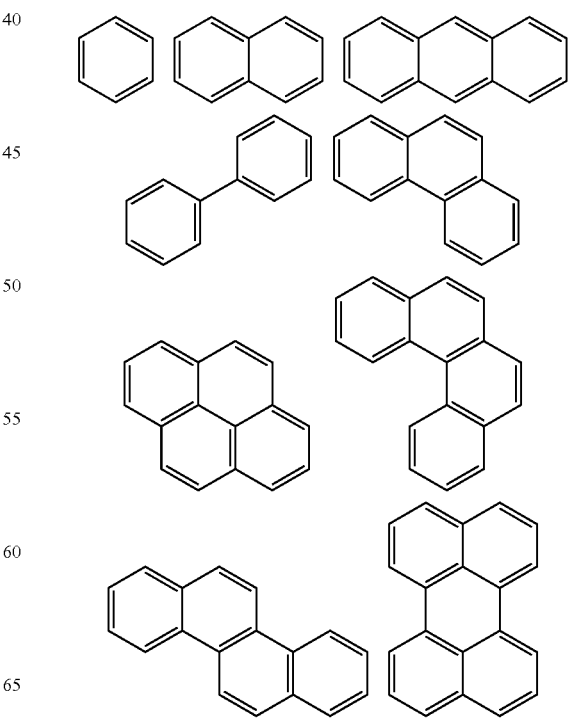

15
-continued

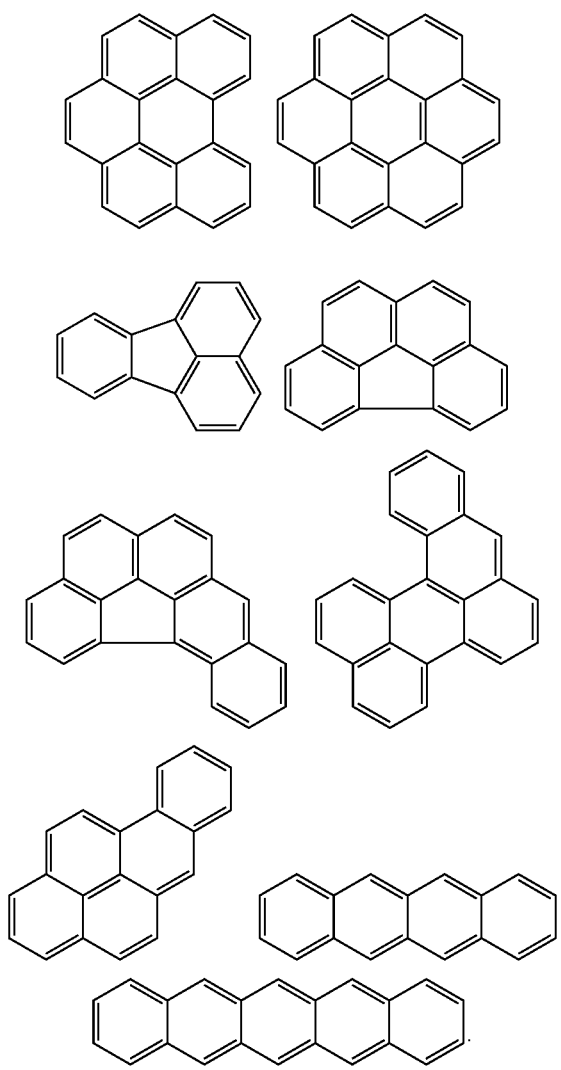

In Chemical Formula 3, the C6 to C30 arylene group may be a divalent group including one of the following moieties:

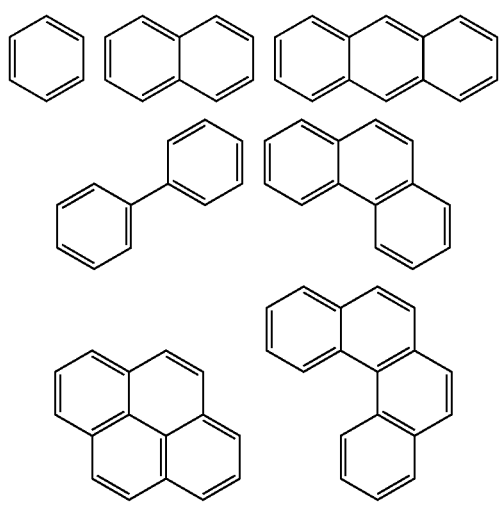

16
-continued

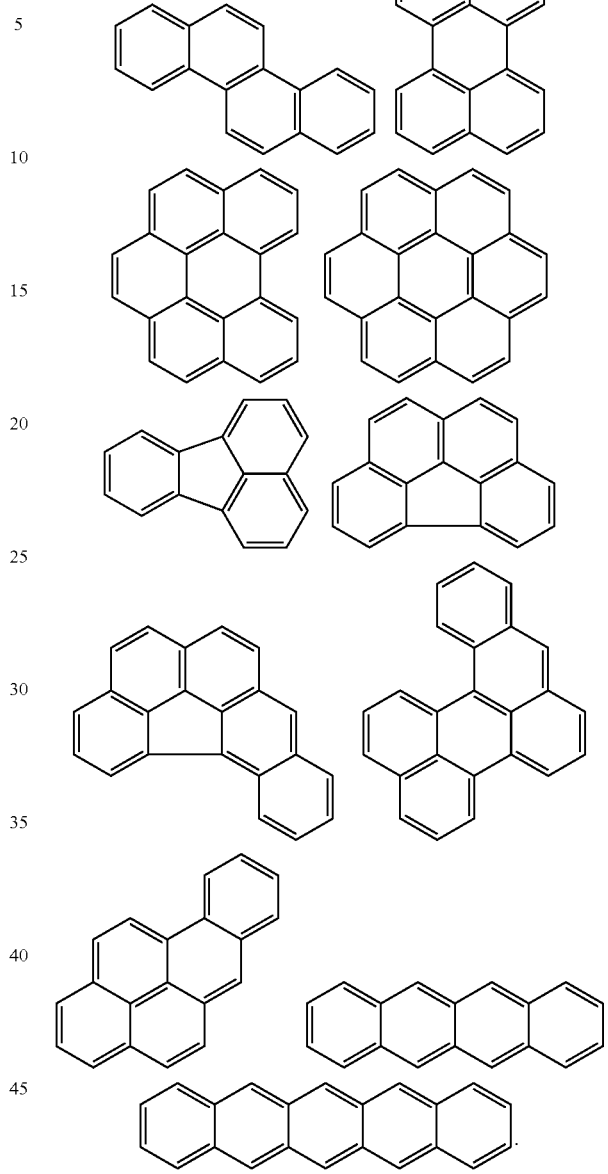

In Chemical Formula 2, at least one of $X^1$ and $X^2$ may be a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof.

In Chemical Formula 3, at least one of $X^3$ to $X^7$ may be a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof.

The polymer may include a moiety represented by one of the following Chemical Formulae 1-1 to 1-4:

[Chemical Formula 1-1]

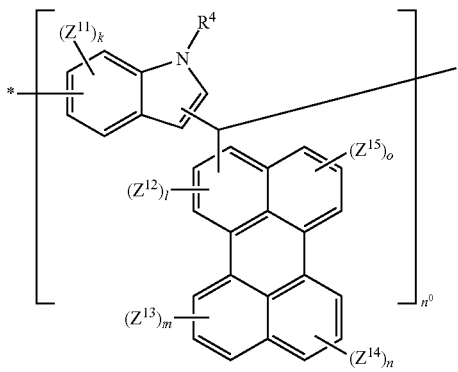

[Chemical Formula 1-2]

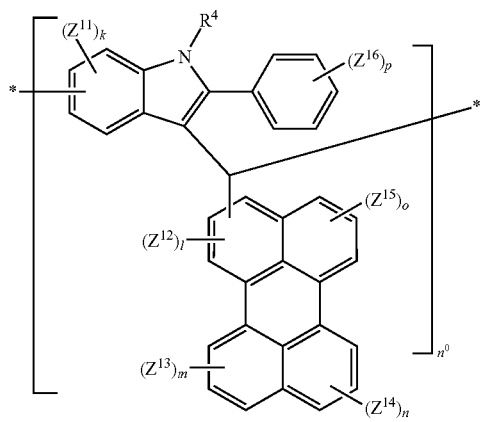

[Chemical Formula 1-3]

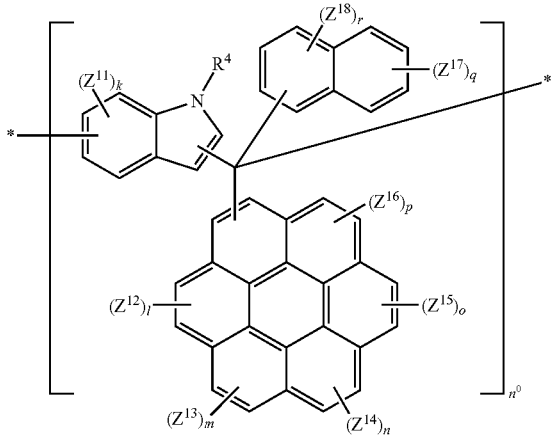

[Chemical Formula 1-4]

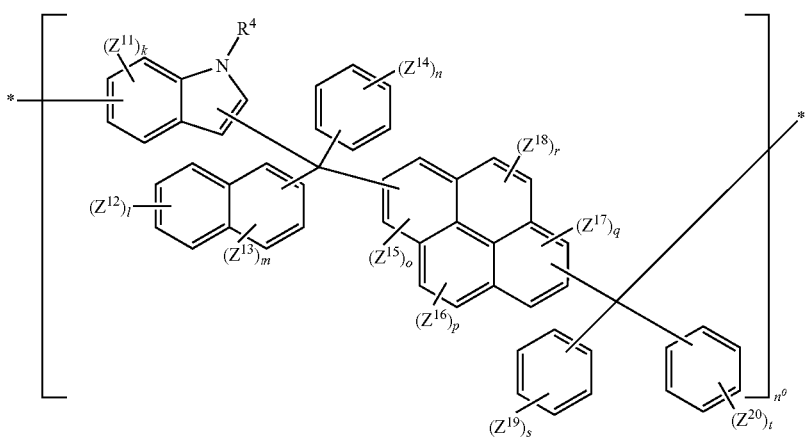

wherein, in Chemical Formulae 1-1 to 1-4, $R^4$ may be hydrogen, a hydroxy group, a halogen, a substituted or unsubstituted C6 to C30 aryl group, or a combination thereof, $Z^{11}$ to $Z^{20}$ may each independently be a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, k, l, m, n, o, p, q, r, s, and t may each independently be an integer of 0 to 2, $n^0$ may be an integer of 2 to 300, and * is a linking point to a neighboring atom.

The polymer may have a weight average molecular weight of about 1,000 to about 200,000.

The polymer may be included in an amount of about 0.1 wt % to about 30 wt %, based on a total weight of the organic layer composition.

The embodiments may be realized by providing an organic layer obtained by curing the organic layer composition according to an embodiment.

The organic layer may be a hard mask layer.

The embodiments may be realized by providing a method of forming patterns, the method including providing a material layer on a substrate, applying the organic layer composition according to an embodiment on the material layer, heat-treating the organic layer composition to form a hardmask layer, forming a silicon-containing thin layer on the hardmask layer, forming a photoresist layer on the silicon-containing thin layer, exposing and developing the photoresist layer to form a photoresist pattern; selectively removing the silicon-containing thin layer and the hardmask layer using the photoresist pattern to expose a part of the material layer, and etching an exposed part of the material layer.

Applying the organic layer composition may include performing a spin-on coating.

The method may further include forming a bottom anti-reflective coating prior to forming the photoresist layer.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening elements may also be present.

As used herein, when a definition is not otherwise provided, the term 'substituted' may refer to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof, instead of a hydrogen atom of a compound.

As used herein, when a definition is not otherwise provided, the term 'hetero' refers to one including 1 to 3 heteroatoms selected from B, N, O, S, and P.

As used herein, when a definition is not otherwise provided, '*' indicates a linking point of a compound or a moiety of a compound, e.g., to a neighboring atom.

In addition, 'a monovalent group' derived from a compound or a monovalent group including a moiety refers to a monovalent group substituting one hydrogen in the compound. For example, a monovalent group derived from a benzene group or including a benzene moiety may be a phenyl group. In addition, 'a divalent group' derived from a compound or a divalent group including a moiety refers to a divalent group substituting two hydrogen to form two linking points in the compound. For example, a divalent group derived from a benzene group or a divalent group including a benzene moiety may be a phenylene group.

Hereinafter, a polymer according to one embodiment is described.

A polymer according to an embodiment may include a moiety represented by Chemical Formula 1.

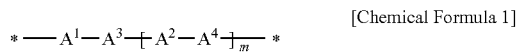

[Chemical Formula 1]

In Chemical Formula 1, m may be 0 or 1, and * represents a binding site or linking point to a neighboring atom.

$A^1$ and $A^2$ may each independently be a divalent group derived from or may be or include a moiety of the following compounds.

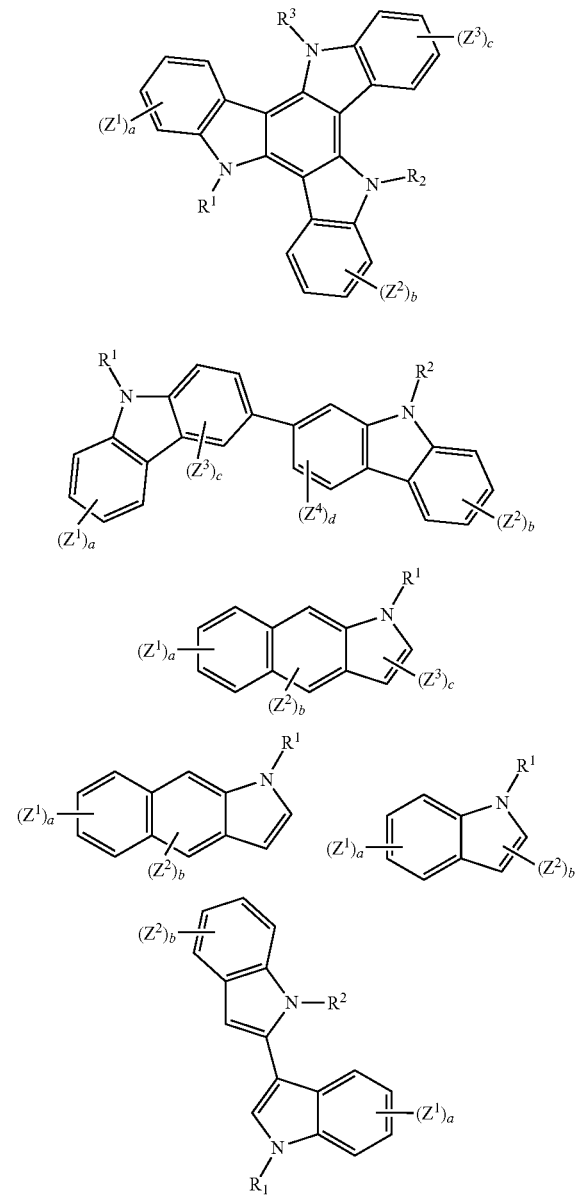

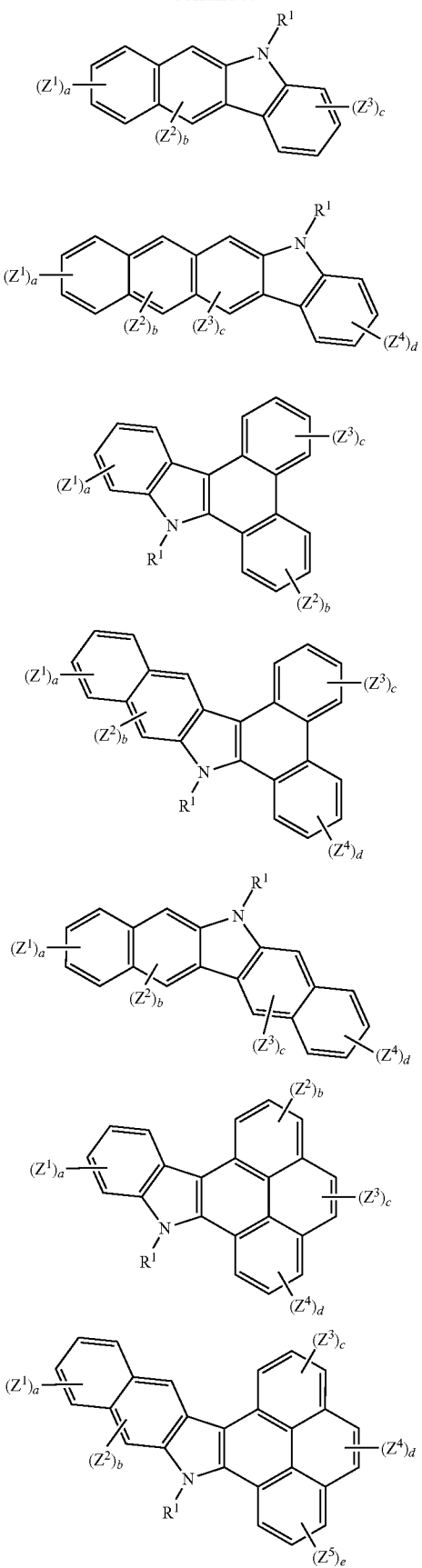
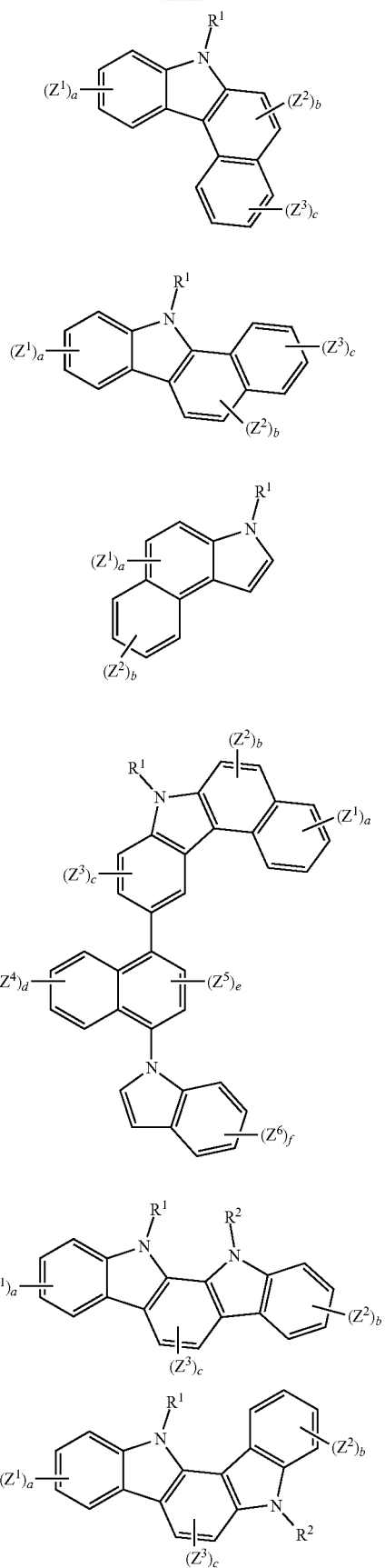

-continued

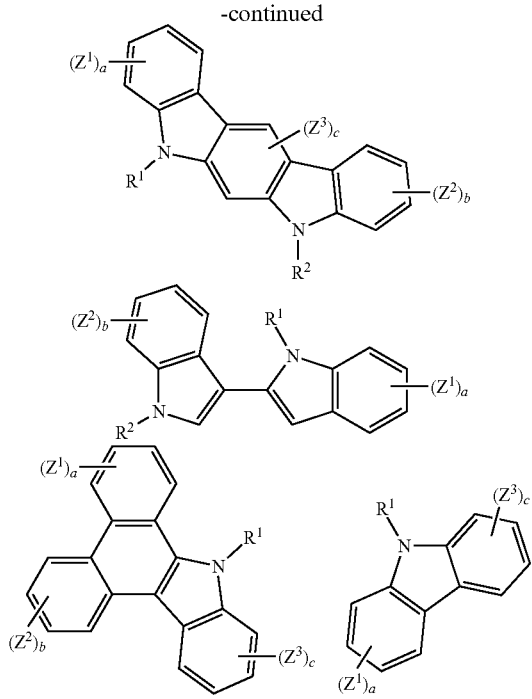

In the above compounds,

R¹, R² and R³ may each independently be or include, e.g., hydrogen (—H), a hydroxy group (—OH), a methoxy (—OCH₃) group, an ethoxy (—OC₂H₅) group, a halogen (—F, —Cl, —Br, —I), a substituted or unsubstituted C6 to C30 aryl group, or a combination thereof, Z¹ to Z⁶ may each independently be or include, e.g., a hydroxy group (—OH), a methoxy (—OCH₃) group, an ethoxy (—OC₂H₅) group, a halogen (—F, —Cl, —Br, —I), a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and a, b, c, d, e and f may each independently be an integer of 0 to 2.

A³ and A⁴ may each independently be a divalent group represented by Chemical Formula 2 or Chemical Formula 3, below.

[Chemical Formula 2]

In Chemical Formula 2,

X¹ and X² may each independently be or include, e.g., hydrogen or a substituted or unsubstituted C6 to C30 aryl group, and at least one of X¹ and X² may be or include, e.g., a substituted or unsubstituted C6 to C30 aryl group.

[Chemical Formula 3]

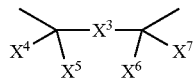

In Chemical Formula 3,

X³ may be or include, e.g., a substituted or unsubstituted C6 to C30 arylene group, and X⁴ to X⁷ may each independently be or include, e.g., a substituted or unsubstituted C6 to C30 aryl group.

The polymer may have a structure in which benzylic hydrogen is minimized while a ring parameter is maximized and thus, may secure excellent etch resistance. For example, six membered aromatic rings included in the polymer may be fully substituted.

In an implementation, the polymer may include at least one of a tertiary carbon and/or a quaternary carbon in the monomer structure. As used herein, the tertiary carbon indicates a carbon structure in which 3 hydrogens out of 4 hydrogens bonded with carbon are replaced by other groups except hydrogen, and the quaternary carbon indicates a carbon structure that 4 hydrogens out of 4 hydrogens bonded with carbon are replaced by other groups except hydrogen. For example, the tertiary carbon may be bound to three carbon atoms and only one hydrogen atom, and the quaternary carbon may be bound to four carbon atoms and not bound to any hydrogen atoms.

When the polymer including the above-described tertiary carbon and/or quaternary carbon is used for or included in an organic layer composition, dissolution or solubility of a hard mask layer may be improved. Thus, the organic layer composition may be particularly suitable for a spin-on coating method.

A moiety including the tertiary carbon or the quaternary carbon in a compound may be the same as shown in Chemical Formulae 2 and 3.

The polymer may include a plurality of moieties represented by Chemical Formula 1, and each moiety of the plurality of moieties may have the same structure or a different structure one another.

In an implementation, in Chemical Formulae 2 and 3, the C6 to C30 aryl group may be a monovalent moiety or group from one of the following compounds.

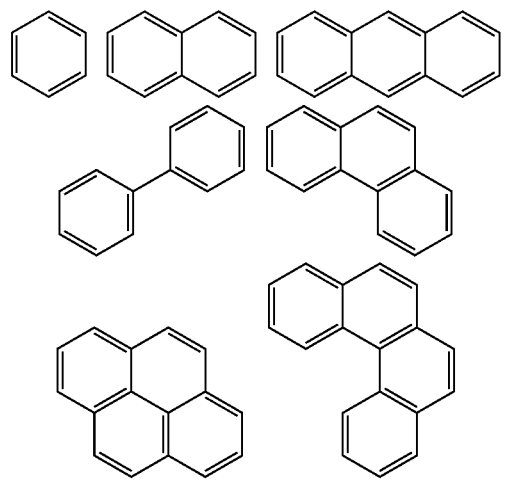

-continued

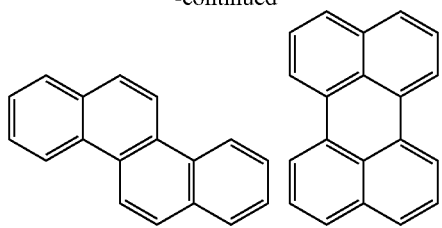

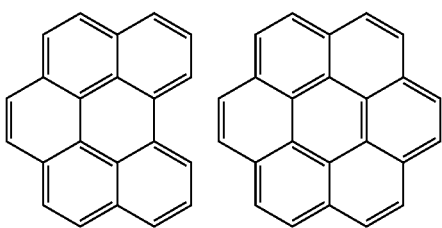

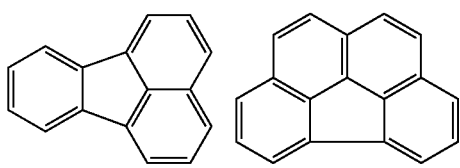

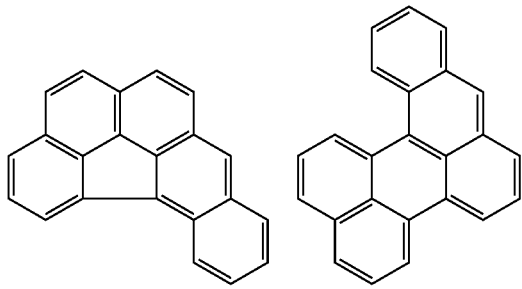

-continued

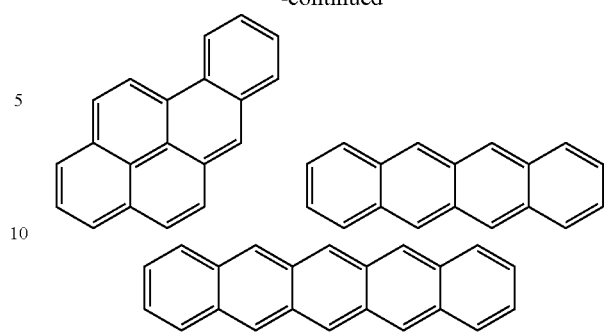

In an implementation, in Chemical Formula 3, the C6 to C30 arylene group may be a divalent moiety or group from one of the above-illustrated compounds (e.g., the compounds described with respect to the C6 to C30 aryl group of Chemical Formulae 2 and 3.

In an implementation, the polymer may include at least one polycyclic aromatic ring group in the moiety represented by Chemical Formula 1. Accordingly, optical properties of the polymer may be secured, and simultaneously, etch resistance may be improved.

In an implementation, in Chemical Formula 2, at least one of $X^1$ and $X^2$ may include, e.g., a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof. In an implementation, at least one of $X^3$ to $X^7$ may include, e.g., a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof.

In an implementation, the polymer may include, e.g., a moiety represented by one of the following Chemical Formulae 1-1 to 1-4.

[Chemical Formula 1-1]

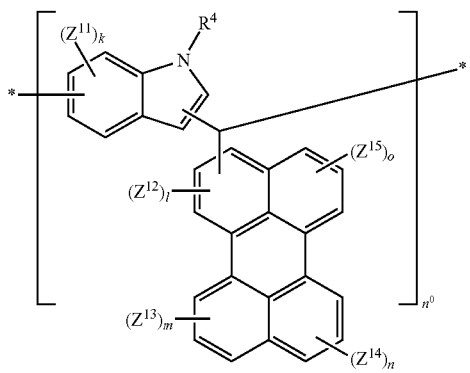

[Chemical Formula 1-2]

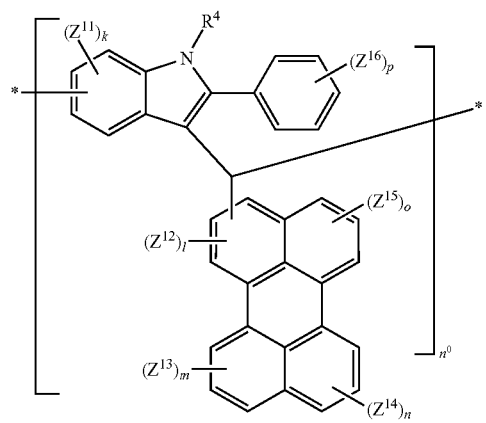

[Chemical Formula 1-3]

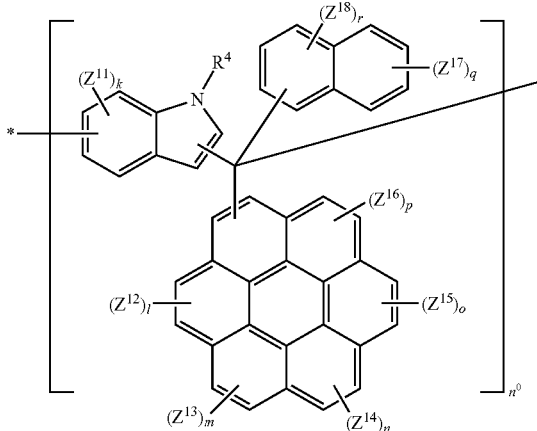

[Chemical Formula 1-4]

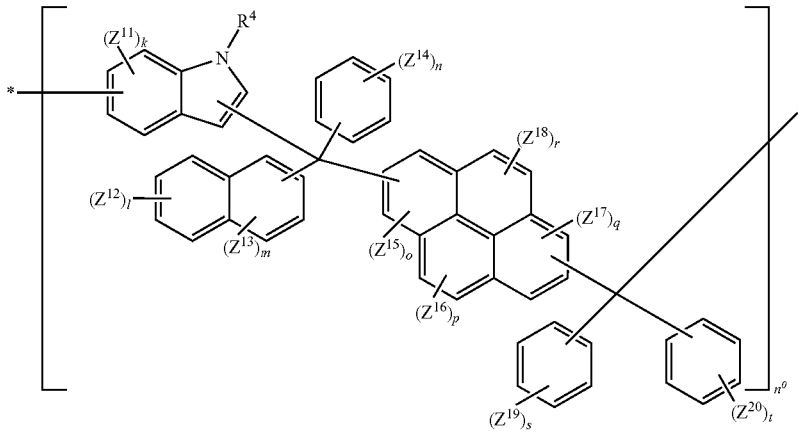

In Chemical Formulae 1-1 to 1-4, $R^4$ may be or include, e.g., hydrogen (—H), a hydroxy group (—OH), a halogen (—F, —Cl, —Br, —I), a substituted or unsubstituted C6 to C30 aryl group, or a combination thereof, $Z^{11}$ to $Z^{20}$ may each independently be or include, e.g., a hydroxy group (—OH), methoxy (—OCH$_3$), ethoxy (—OC$_2$H$_5$), a halogen (—F, —Cl, —Br, —I), a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, k, l, m, n, o, p, q, r, s and t may each independently be an integer of 0 to 2, and $n^0$ may be an integer of 2 to 300.

In Chemical Formulae 1-1 to 1-4, * is a linking point.

The polymer may have a weight average molecular weight of about 1,000 to about 200,000. When the polymer has a weight average molecular weight within the range, an organic layer composition (e.g., a hard mask composition) including the polymer may be optimized by adjusting the amount of carbon and solubility in a solvent.

Another embodiment may provide an organic layer composition (including the polymer described above) and a solvent.

The solvent may exhibit sufficient dissolubility or dispersion for the polymer. For example, the solvent may include at least one selected from propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, and ethyl 3-ethoxypropionate.

The polymer may be included in an amount of about 0.1 to about 30 wt %, based on a total weight of the organic layer composition. When the polymer is included in the range, a thickness, surface roughness and planarization of the organic layer may be controlled.

The organic layer composition may further include an additive, e.g., a surfactant, a cross-linking agent, a thermal acid generator, a plasticizer, or the like.

The surfactant may include, e.g., alkylbenzene sulfonate salt, alkyl pyridinium salt, polyethylene glycol, or a quaternary ammonium salt.

The cross-linking agent may be, e.g., a melamine-based, a substituted urea-based, or a polymer-based agent thereof. In an implementation, a cross-linking agent having at least two cross-linking forming substituent may be, e.g., a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea, or the like.

In addition, the cross-linking agent may have high heat resistance. The cross-linking agent having high heat resistance may be a compound containing a cross-linking substituent having an aromatic ring (e.g., a benzene ring, a naphthalene ring) in its molecule.

The thermal acid generator may be, e.g., an acidic compound such as p-toluenesulfonic acid, trifluoromethanesulfonic acid, pyridiniump-toluenesulfonic acid, salicylic acid, sulfosalicylic acid, citric acid, benzoic acid, hydroxybenzoic acid, naphthalenecarbonic acid and the like or/and 2,4,4,6-tetrabromocyclohexadienone, benzointosylate, 2-nitrobenzyltosylate, other organosulfonic acid alkylester, or the like.

The additive may be included in an amount of about 0.001 to 40 parts by weight, based on 100 parts by weight of the organic layer composition. When the additive is included within the range, solubility may be improved without changing optical properties of the organic layer composition.

Another embodiment may provide an organic layer manufactured using the organic layer composition. The organic layer may be, e.g., formed by coating the organic layer composition on a substrate and heat-treating it for curing and may include, e.g., a hardmask layer, a planarization layer, a sacrificial layer, a filler, and the like for an electronic device.

Hereafter, a method for forming patterns by using the organic layer composition is described.

A method of forming patterns according to another embodiment may include providing a material layer on a substrate, applying the organic layer composition including the polymer and a solvent heat-treating the organic layer composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, e.g., a silicon wafer, a glass substrate, or a polymer substrate.

The material layer may be a material to be finally patterned, e.g., a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The organic layer composition may be the same as described above, and may be applied by spin-on coating in a form of a solution. In an implementation, a thickness of the organic layer composition may be, e.g., about 50 Å to about 10,000 Å.

The heat-treating the organic layer composition may be performed, e.g., at about 100 to about 500° C. for about 10 seconds to 1 hour.

The silicon-containing thin layer may be formed of, e.g., a material such as SiCN, SiOC, SiON, SiOCN, SiC, SiN, or the like.

In an implementation, the method may further include forming a bottom antireflective coating (BARC) before forming the photoresist layer.

Exposure of the photoresist layer may be performed using, e.g., ArF, KrF, or EUV. After exposure, heat treatment may be performed at about 100° C. to about 500° C.

The etching process of the exposed part of the material layer may be performed through a dry etching process using an etching gas and the etching gas may be, e.g., $CHF_3$, $CF_4$, $Cl_2$, $BCl_3$, and a mixed gas thereof.

The etched material layer may be formed in a plurality of patterns, and the plurality of patterns may be a metal pattern, a semiconductor pattern, an insulation pattern, and the like, for example diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLE

Synthesis Example 1

1H-indole (11.7 g, 0.1 mol), 1-perylene carboxaldehyde (28.0 g, 0.1 mol), p-toluene sulfonic acid monohydrate (9.5 g, 0.05 mol) and 1,4-dioxane (60 g) were put in a flask and then agitated at 100° C. The reaction was completed when a sample taken from the polymerization reactant by every hour had a weight average molecular weight ranging from 2,000 to 3,000. When the reaction was complete, 100 g of hexane was added thereto to extract 1,4-dioxane, methanol was added thereto for precipitation, a precipitate obtained therefrom was filtered, and remaining monomer was removed by using methanol, obtaining a polymer represented by Chemical Formula 1aa (Mw: 2,300).

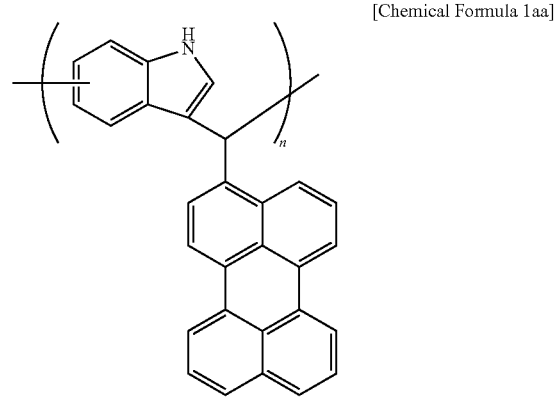

[Chemical Formula 1aa]

Synthesis Example 2

2-Phenyl-1H-indole (19.3 g, 0.1 mol), 1-perylene carboxaldehyde (28.0 g, 0.1 mol), p-toluene sulfonic acid monohydrate (9.5 g, 0.05 mol), and 1,4-dioxane (70 g) were put in a flask and agitated at 100° C. When a sample taken from the polymerization reactant every hour had a weight average molecular weight ranging from 2,000 to 3,000, the reaction was completed. When the reaction was complete, 100 g of hexane was added thereto to extract 1,4-dioxane, a precipitate produced by adding methanol thereto was filtered, and remaining monomer was removed by using methanol, obtaining a polymer (Mw: 2,750) represented by Chemical Formula 1bb.

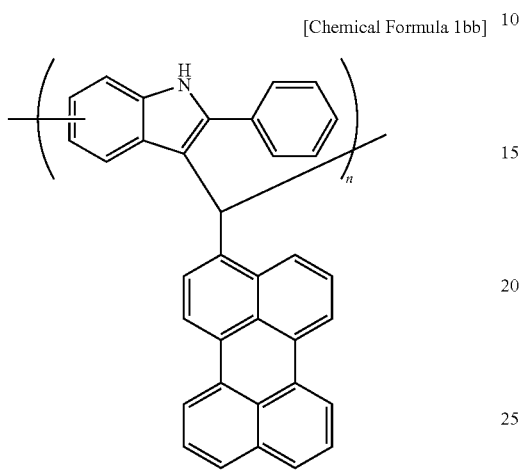

[Chemical Formula 1bb]

Synthesis Example 3

Coronene (30 g, 0.1 mol) and 2-naphthoyl chloride (19 g, 0.1 mol) were put in a flask containing dichloroethane (170 g) and dissolved therein. After 15 minutes, $AlCl_3$ (16 g, 0.12 mol) was slowly added thereto, and the mixture was reacted at ambient temperature for 4 hours. When the reaction was complete, the $AlCl_3$ was removed by using water, and the remnant was concentrated with an evaporator, obtaining the following compound S1.

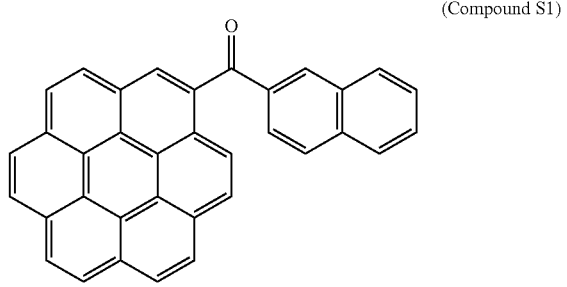 [SMILES: O=C(c1ccc2ccccc2c1)c1cc2ccc3ccc4ccc5ccc6ccc1c1c6c5c4c3c21]

(Compound S1)

Subsequently, the compound S1 (45.5 g, 0.1 mol), 1H-indole (11.7 g, 0.1 mol), p-toluene sulfonic acid monohydrate (9.5 g, 0.05 mol), and 1,4-dioxane (82 g) were put in a flask and agitated at 100° C. When a sample taken from the polymerization reactant every hour had a weight average molecular weight ranging from 2,000 to 3,000, the reaction was completed. When the reaction was complete, hexane (100 g) was added thereto to extract 1,4-dioxane, a precipitate formed by adding methanol thereto was filtered, and remaining monomer was removed therefrom by using methanol, obtaining a polymer (Mw: 2,900) represented by Chemical Formula 1cc.

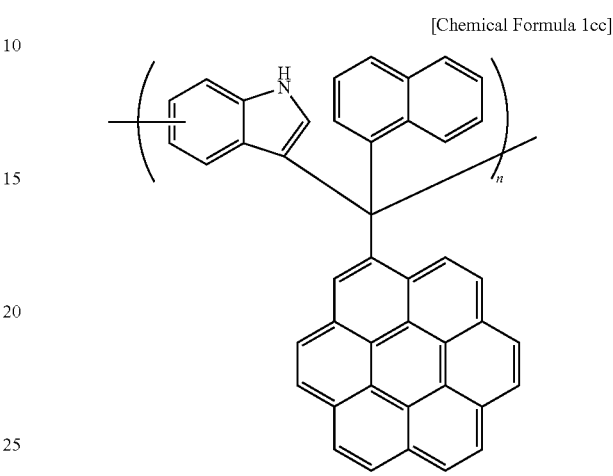

[Chemical Formula 1cc]

Synthesis Example 4

Pyrene (20 g, 0.1 mol), benzoyl chloride (14 g, 0.1 mol), and 2-naphthoyl chloride (19 g, 0.1 mol) were put in a flask containing dichloroethane (160 g) and dissolved therein. After 15 minutes, $AlCl_3$ (33.3 g, 0.25 mol) was slowly added thereto, and the mixture was reacted at ambient temperature for 6 hours. When the reaction was complete, the $AlCl_3$ was removed therefrom, and the remnant was concentrated with an evaporator, obtaining the following compound S2.

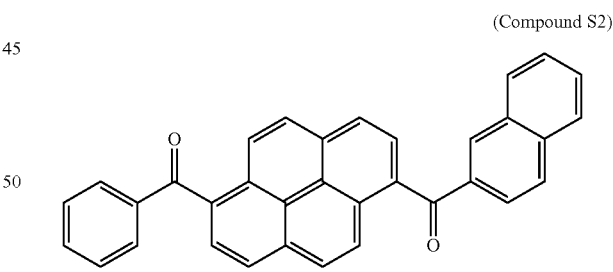

(Compound S2)

Subsequently, the compound S2 (27.6 g, 0.06 mol) was dissolved in anhydrous THF (140 g) under a nitrogen atmosphere (reacted in a −78° C. ice-bath). Then, PhMgBr (32.6 g, 0.18 mol) was slowly added to the solution, and the mixture was agitated. After 2 hours, the ice-bath was removed, and the mixture was additionally reacted for 12 hours. When the reaction was complete, the resultant was extracted with a mixed solvent of ethyl acetate/$H_2O$ and then, precipitated with n-hexane after removing an organic solvent, obtaining the following compound S3.

(Compound S3)

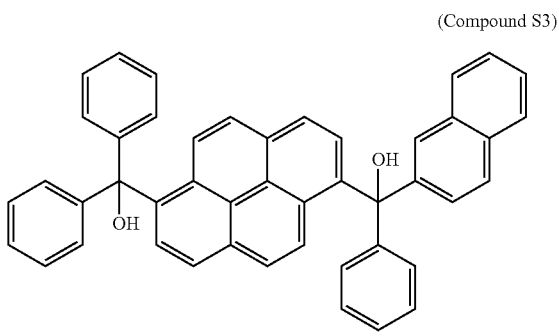 [SMILES: OC(c1ccccc1)(c1ccccc1)c1ccc2ccc3c(C(O)(c4ccccc4)c4ccc5ccccc5c4)ccc4ccc1c2c43]

Subsequently, the compound S3 (31 g, 0.05 mol), 1H-indole (5.9 g, 0.05 mol), p-toluenesulfonic acid monohydrate (4.8 g, 0.025 mol), and 1,4-dioxane (51 g) were put in a flask and agitated at 100° C. When a sample taken from the polymerization reactant every hour had a weight average molecular weight ranging from 2,000 to 3,000, the reaction was completed. When the reaction was complete, hexane (100 g) was added thereto to extract 1,4-dioxane, a precipitate formed by adding methanol thereto was filtered, and remaining monomer was removed therefrom, obtaining a polymer (Mw: 2,900) represented by Chemical Formula 1dd.

were sequentially put in a 500 ml flask equipped with a thermometer, a condenser, and a mechanical agitator, and dissolved in propylene glycol monomethyl ether acetate (PGMEA, 51 g). Then, diethyl sulfite (0.15 g, 0.001 mol) was added thereto, and the mixture was agitated at 90 to 120° C. for 5 to 10 hours. When a sample taken from the polymerization reactant every hour had a weight average molecular weight ranging from 1,800 to 2,300, the reaction was completed.

When the polymerization reaction was complete, the reactant was subsequently cooled down to ambient temperature and added to distilled water (40 g) and methanol (400 g), and the mixture was agitated and allowed to stand. After removing a supernatant therefrom, a precipitate formed therein was dissolved in propylene glycol monomethyl ether acetate (PGMEA, 80 g), and the solution was fervently agitated with methanol (40 g) and water (40 g) and allowed to stand (primary). Herein, the obtained supernatant was removed again, and a precipitate formed therein was dissolved in propylene glycol monomethyl ether acetate (PGMEA, 40 g) (secondary). The primary and secondary processes were regarded as one purification process, and this purification process was performed three times in total. The purified polymer was dissolved in propylene glycol monomethyl ether acetate (PGMEA, 80 g), and methanol and distilled water remaining in the solution was removed under a reduced pressure, obtaining a polymer represented by Chemical Formula A (a weight average molecular weight (Mw)=2,500).

[Chemical Formula 1dd]

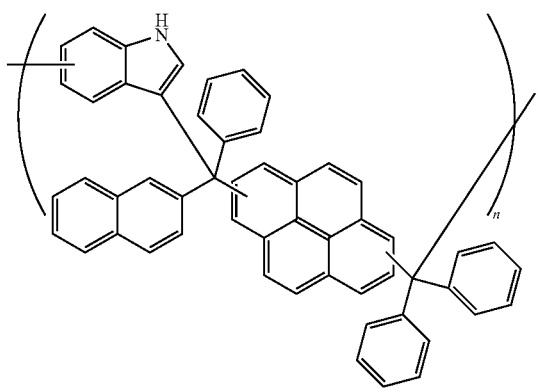

[Chemical Formula A]

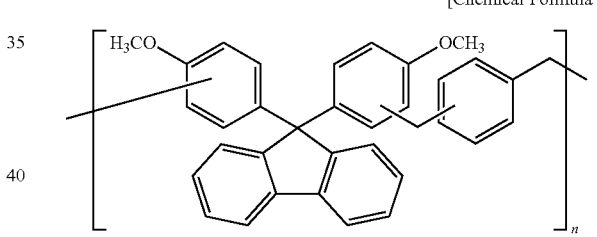

Comparative Synthesis Example 1

9,9-bis (4-methoxyphenyl)-9H-fluorene (21.6 g, 0.057 mol) and 1,4-bis(methoxymethyl)benzene (9.6 g, 0.057 mol)

Comparative Synthesis Example 2

A polymer represented by Chemical Formula B (a weight average molecular weight (Mw)=2,500) was obtained according to the same method as Comparative Synthesis Example 1 by using 4-methoxypyrene (23.2 g, 0.1 mol), 1,4-bis(methoxymethyl)benzene (33.2 g, 0.2 mol), 1-methoxynaphthalene (15.8 g, 0.1 mol), propylene glycol monomethyl ether acetate (PGMEA, 72.2 g) and diethylsulfate (0.62 g, 4 mmol).

[Chemical Formula B]

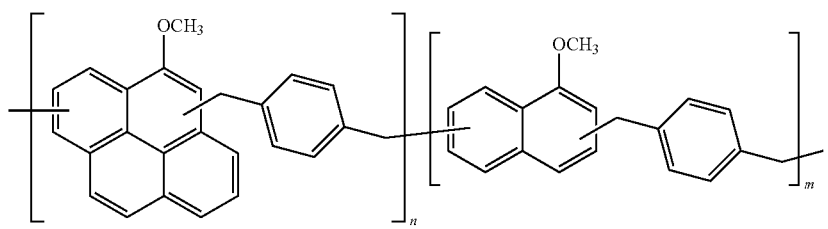

PREPARATION OF HARDMASK COMPOSITION

Example 1

The compound according to Synthesis Example 1 was dissolved in a mixed solvent of propylene glycol monomethyl ether acetate (PGMEA) and cyclohexanone (7:3 (v/v)), and the solution was filtered, preparing a hard mask composition. Herein, the compound was included in an amount range of 3 to 15 wt %, based on the total weight of the hard mask composition (depending on a desired thickness).

Example 2

A hard mask composition was prepared according to the same method as Example 1 except for using the compound according to Synthesis Example 2 instead of the compound according to Synthesis Example 1.

Example 3

A hard mask composition was prepared according to the same method as Example 1 except for using the compound according to Synthesis Example 3 instead of the compound according to Synthesis Example 1.

Example 4

A hard mask composition was prepared according to the same method as Example 1 except for using the compound according to Synthesis Example 4 instead of the compound according to Synthesis Example 1.

Comparative Example 1

A hard mask composition was prepared according to the same method as Example 1 except for using the compound according to Comparative Synthesis Example 1 instead of the compound according to Synthesis Example 1.

Comparative Example 2

A hard mask composition was prepared according to the same method as Example 1 except for using the compound according to Comparative Synthesis Example 2 instead of the compound according to Synthesis Example 1.

Evaluation

Evaluation 1: Film Density

Each hard mask composition according to Examples 1 to 4 and Comparative Examples 1 and 2 was spin-on coated to be 300 Å thick on a silicon wafer, heat-treated on a hot plate at 400° C. for 2 minutes to form a thin film, and the thickness of the thin film was measured. Subsequently, film density was measured by using XRD.

The results are provided in Table 1.

TABLE 1

| | Film density (g/cm$^3$) Baked at 400° C. |
|---|---|
| Example 1 | 1.25 |
| Example 2 | 1.28 |
| Example 3 | 1.31 |
| Example 4 | 1.33 |

TABLE 1-continued

| | Film density (g/cm$^3$) Baked at 400° C. |
|---|---|
| Comparative Example 1 | 1.10 |
| Comparative Example 2 | 1.15 |

Referring to Table 1, each thin film respectively formed of the hard mask compositions according to Examples 1 to 4 showed higher layer density than each thin film respectively formed of the hard mask compositions according to Comparative Examples 1 and 2.

Evaluation 2: Etch Resistance

Each hard mask composition according to Examples 1 to 4 and Comparative Examples 1 and 2 was spin-on coated to be 4,000 Å thick on a silicon wafer and heat-treated on a hot plate at 400° C. for 2 minute to form a thin film, and then, the thickness of the thin film was measured. Subsequently, each the thin film was dry etched by using $CHF_3/CF_4$ mixed gas and $N_2/O_2$ mixed gas, and then, the thickness of the thin film was measured again. The thicknesses of the thin film before and after the dry etching and etching time were used to calculate a bulk etch rate (BER) according to the following Calculation Equation 1.

(Thickness of initial thin film−Thickness of thin film after etching)/Etching time (Å/s) [Calculation Equation 1]

The results are provided in Table 2.

TABLE 2

| | Bulk etch rate (Å/sec) | |
|---|---|---|
| | $CHF_3/CF_4$ mixed gas | $N_2/O_2$ mixed gas |
| Example 1 | 23.5 | 25.1 |
| Example 2 | 23.1 | 24.7 |
| Example 3 | 22.8 | 24.1 |
| Example 4 | 22.4 | 23.6 |
| Comparative Example 1 | 30.1 | 28.5 |
| Comparative Example 2 | 29.5 | 27.8 |

Referring to Table 2, each thin film respectively formed of the hard mask compositions according to Examples 1 to 4 showed sufficient etch resistance with etching gas and thus, improved bulk etch characteristics, compared with each thin film respectively formed of the hard mask compositions according to Comparative Examples 1 and 2.

By way of summation and review, according to smallsizing the pattern to be formed, it may be difficult to provide a fine pattern having an excellent profile by using some lithographic techniques. Accordingly, a layer, called a hardmask layer, may be formed between the material layer and the photoresist layer to provide a fine pattern. The hardmask layer may play a role of an intermediate layer for transferring the fine pattern of photoresist to the material layer through the selective etching process. Accordingly, the hardmask layer may have characteristics such as heat resistance and etch resistance, and the like to be tolerated during the multiple etching processes. Forming a hardmask layer by a spin-on coating method instead of the chemical vapor deposition has been considered. The spin-on coating method may be easy to perform and may also help improve gap-fill characteristics and planarization characteristics. The gap-fill characteristics of filling a pattern with the layer without a space may be beneficial when multiple patterns are necessarily used to realize a fine pattern. In addition, the planarization characteristics of planarizing the surface of the layer with a lower layer may be beneficial when a substrate has a bump, or a wafer as the substrate has both a pattern-dense region and no pattern region. The embodiments may provide an organic layer material developed with a view toward the above-described characteristics.

The embodiments may provide a polymer that helps ensure improved film density and etch resistance and excellent solubility.

The embodiments may provide an organic layer that helps simultaneously exhibits etch resistance and planarization characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A polymer including a moiety represented by Chemical Formula 1:

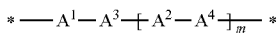

[Chemical Formula 1]

wherein, in Chemical Formula 1,
* is a linking point to a neighboring atom,
m is 0 or 1,
$A^1$ and $A^2$ are each independently a divalent group including one of the following moieties,

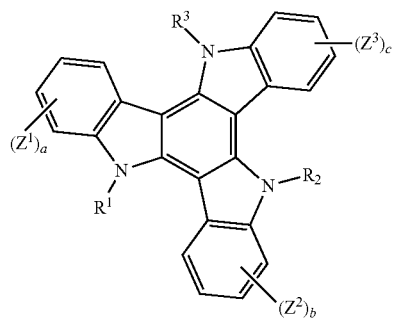

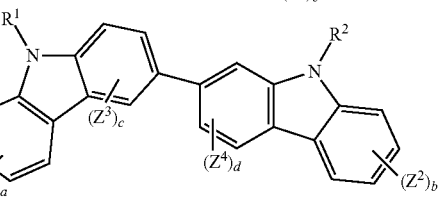

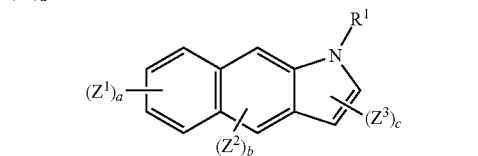

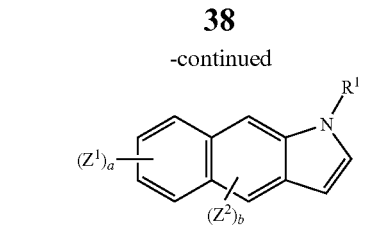

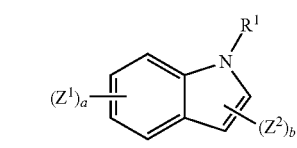

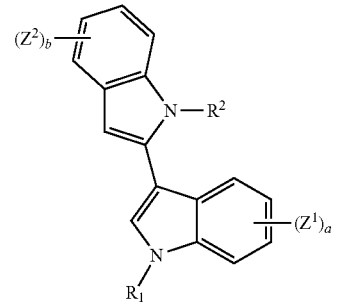

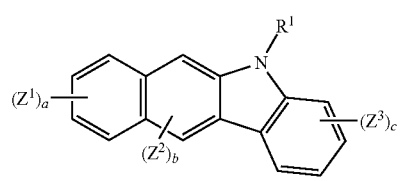

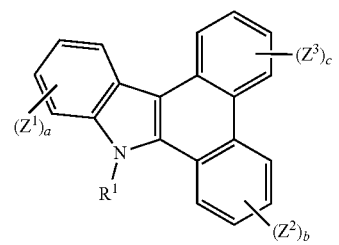

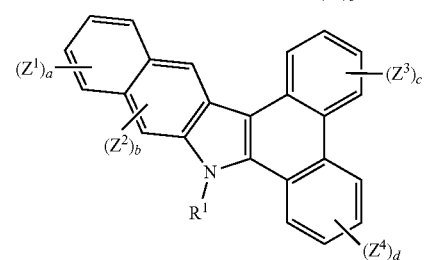

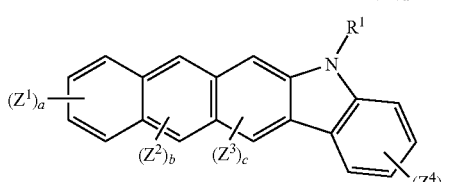

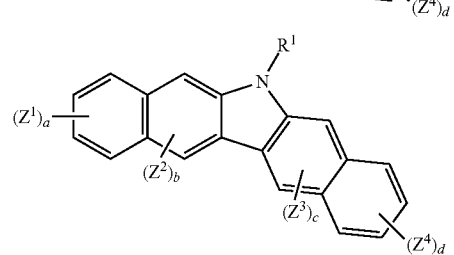

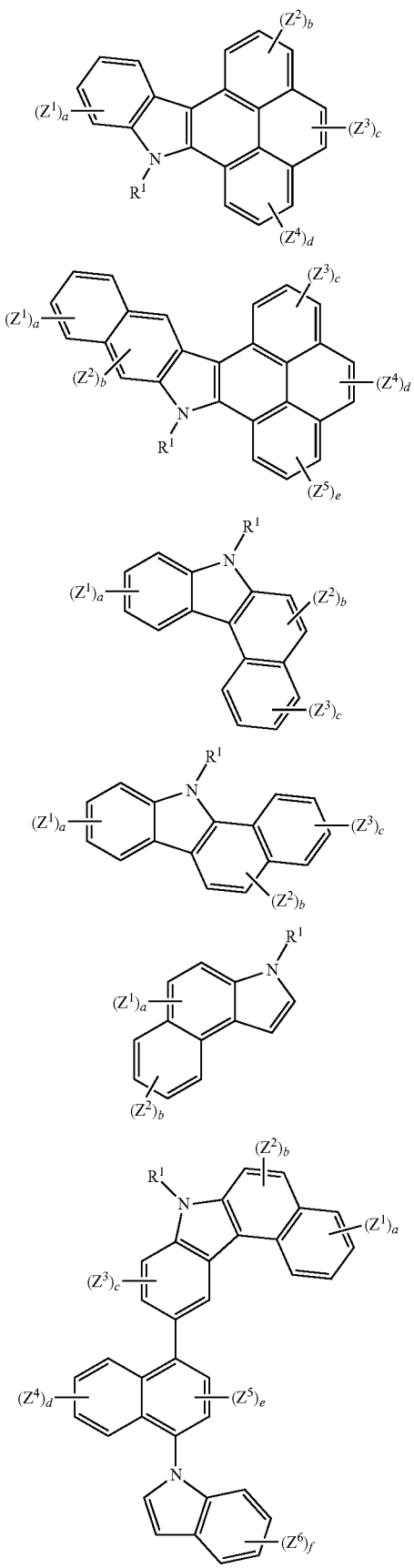
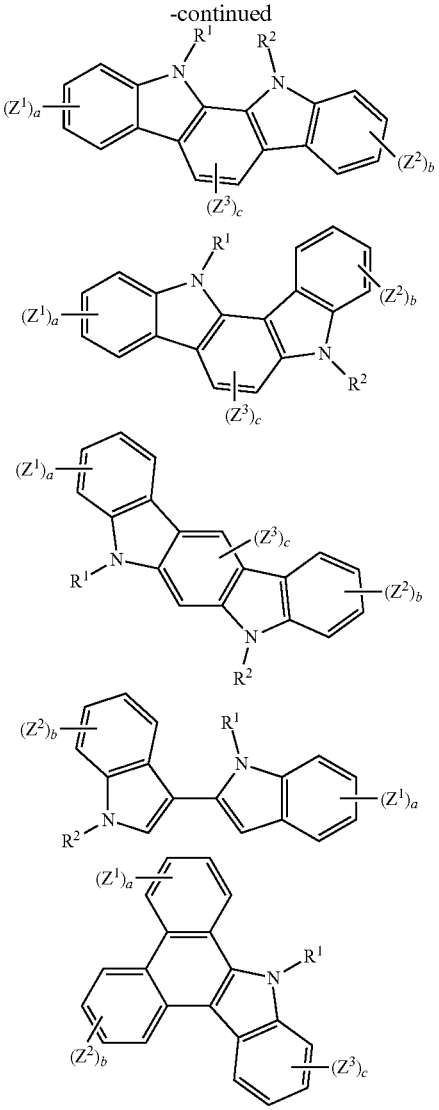

wherein, in the above moieties,

R¹, R² and R³ are each independently hydrogen, a hydroxy group, a methoxy group, an ethoxy group, a halogen, a substituted or unsubstituted C6 to C30 aryl group, or a combination thereof, $Z^1$ to $Z^6$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and a, b, c, d, e, and f are each independently an integer of 0 to 2, $A^3$ and $A^4$ are each independently a divalent group represented by Chemical Formula 2 or Chemical Formula 3, below,

[Chemical Formula 2]

[Chemical Formula 3]

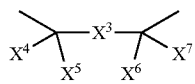

wherein, in Chemical Formula 2, $X^1$ and $X^2$ are each independently hydrogen or a substituted or unsubstituted C6 to C30 aryl group, and at least one of $X^1$ and $X^2$ is a substituted or unsubstituted C6 to C30 aryl group, wherein, in Chemical Formula 3, $X^3$ is a substituted or unsubstituted C6 to C30 arylene group, and $X^4$ to $X^7$ are each independently a substituted or unsubstituted C6 to C30 aryl group, wherein, in Chemical Formula 1, when $A^1$ or $A^2$ is a divalent group including the moiety

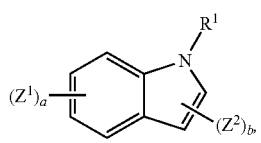

the divalent group is bonded to $A^3$ or $A^4$ at the nitrogen-containing ring of the moiety.

2. The polymer as claimed in claim 1, wherein, in Chemical Formulae 2 and 3, the C6 to C30 aryl group is a monovalent group including one of the following moieties:

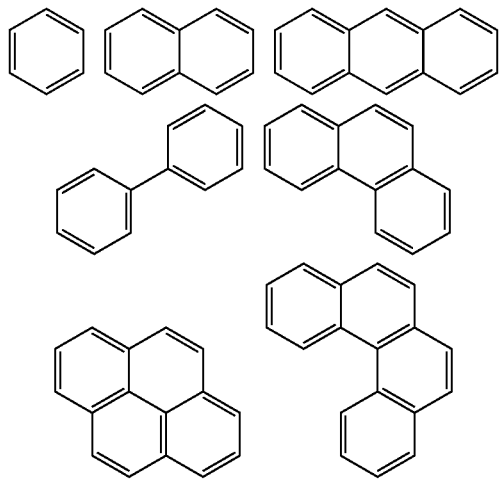

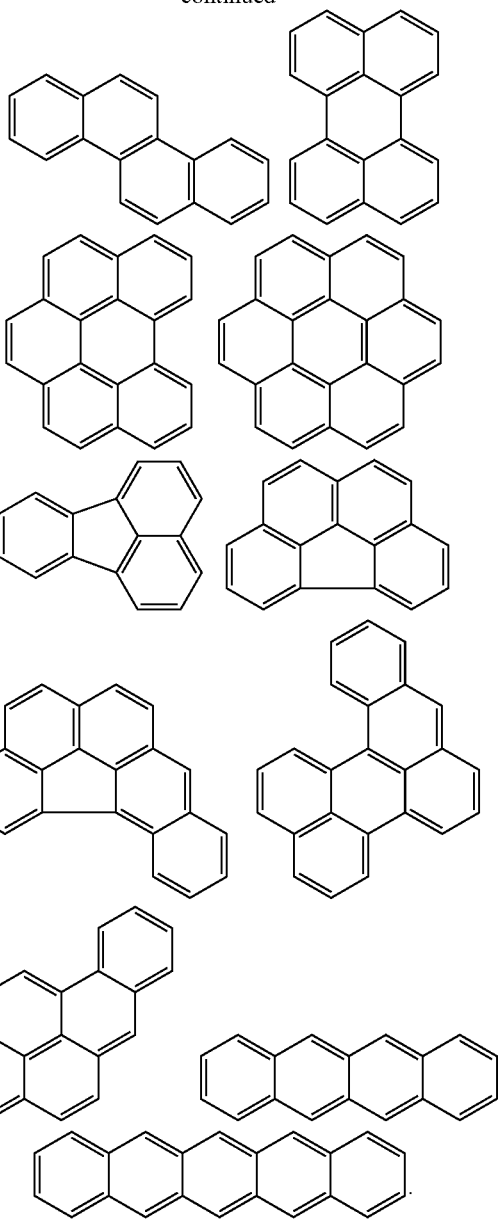

3. The polymer as claimed in claim 1, wherein:

one of $A^3$ or $A^4$ is a divalent group represented by Chemical Formula 3, and in Chemical Formula 3, the C6 to C30 arylene group is a divalent group including one of the following moieties:

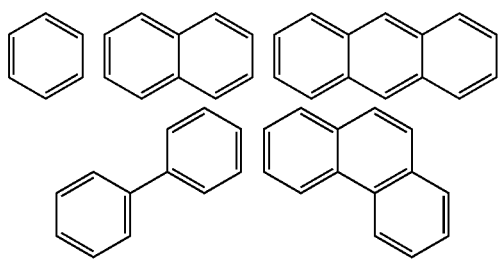

-continued

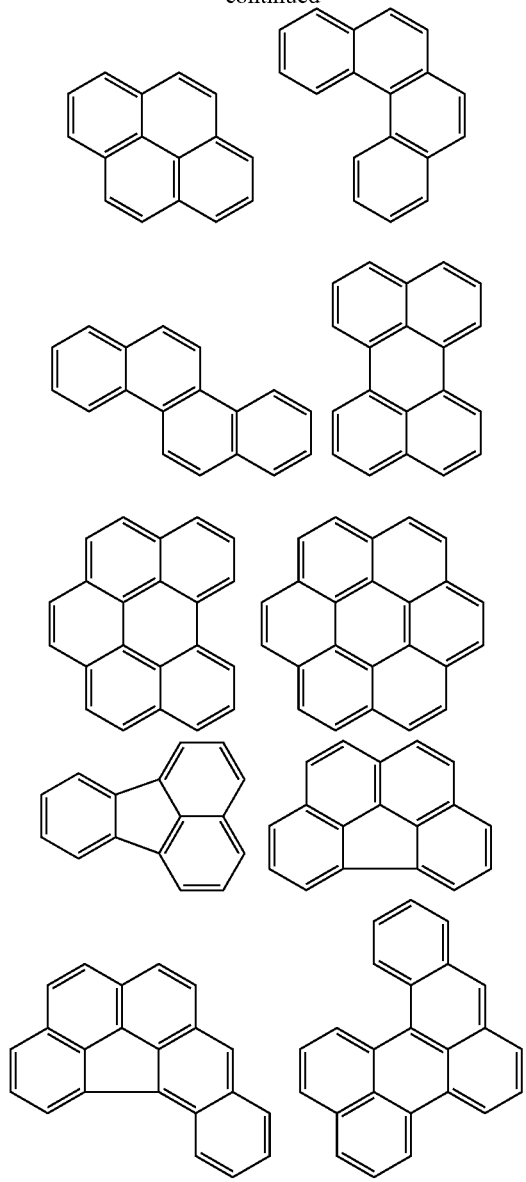

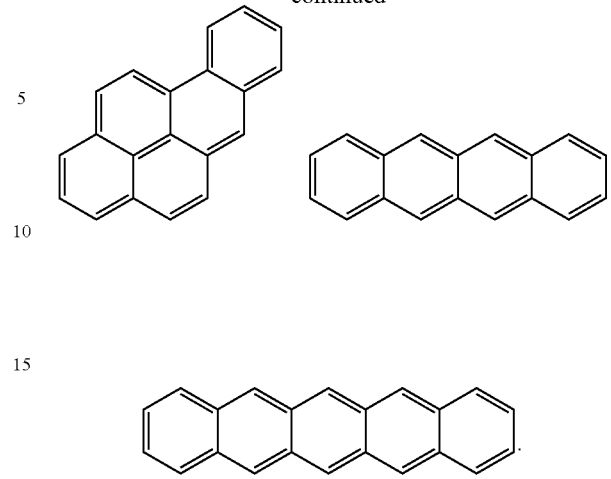

4. The polymer as claimed in claim 1, wherein:
one of $A^3$ or $A^4$ is a divalent group represented by Chemical Formula 2, and
in Chemical Formula 2, at least one of $X^1$ and $X^2$ is a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof.

5. The polymer as claimed in claim 1, wherein:
one of $A^3$ or $A^4$ is a divalent group represented by Chemical Formula 3, and
in Chemical Formula 3, at least one of $X^3$ to $X^7$ is a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof.

6. The polymer as claimed in claim 1, wherein the polymer includes a moiety represented by one of the following Chemical Formulae 1-1 to 1-4:

[Chemical Formula 1-1]

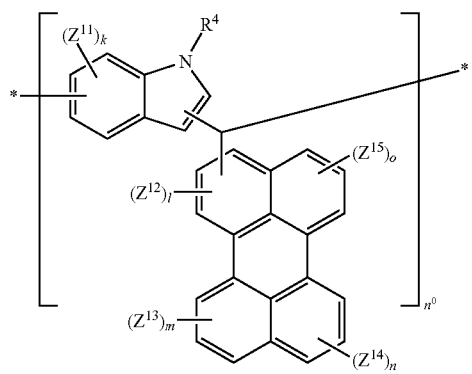

[Chemical Formula 1-2]

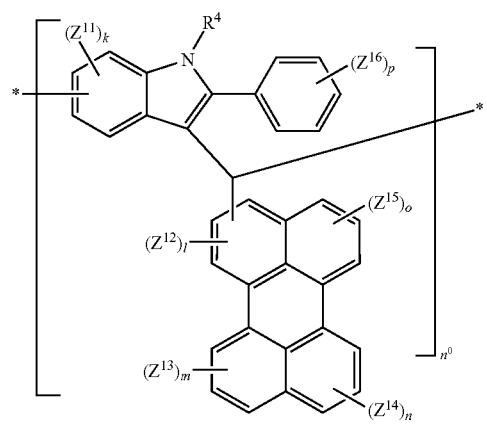

-continued

[Chemical Formula 1-3]

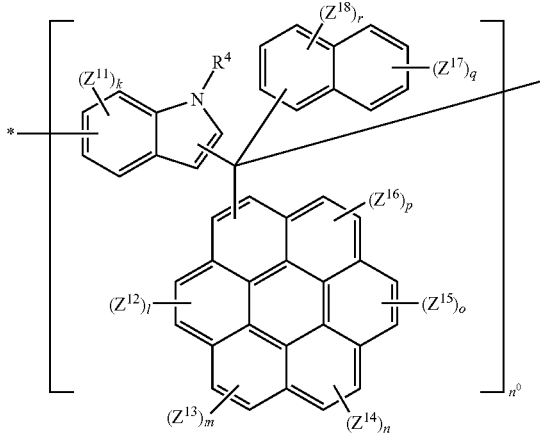

[Chemical Formula 1-4]

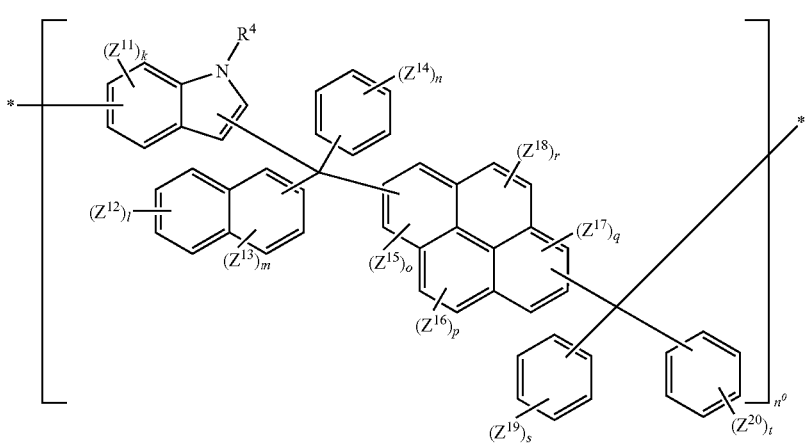

wherein, in Chemical Formulae 1-1 to 1-4, $R^4$ is hydrogen, a hydroxy group, a halogen, a substituted or unsubstituted C6 to C30 aryl group, or a combination thereof, $Z^{11}$ to $Z^{20}$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, k, l, m, n, o, p, q, r, s, and t are each independently an integer of 0 to 2, $n^o$ is an integer of 2 to 300, and

* is a linking point to a neighboring atom.

7. The polymer as claimed in claim 1, wherein the polymer has a weight average molecular weight of about 1,000 to about 200,000.

8. An organic layer composition, comprising:
a solvent; and
a polymer including a moiety represented by the following Chemical Formula 1,

[Chemical Formula 1]

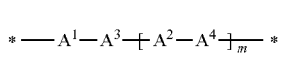

wherein, in Chemical Formula 1,

* is a linking point to a neighboring atom, m is 0 or 1, $A^1$ and $A^2$ are each independently a divalent group including one of the following moieties,

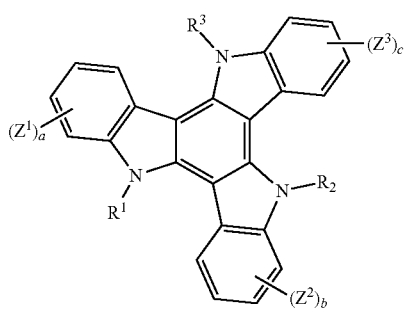

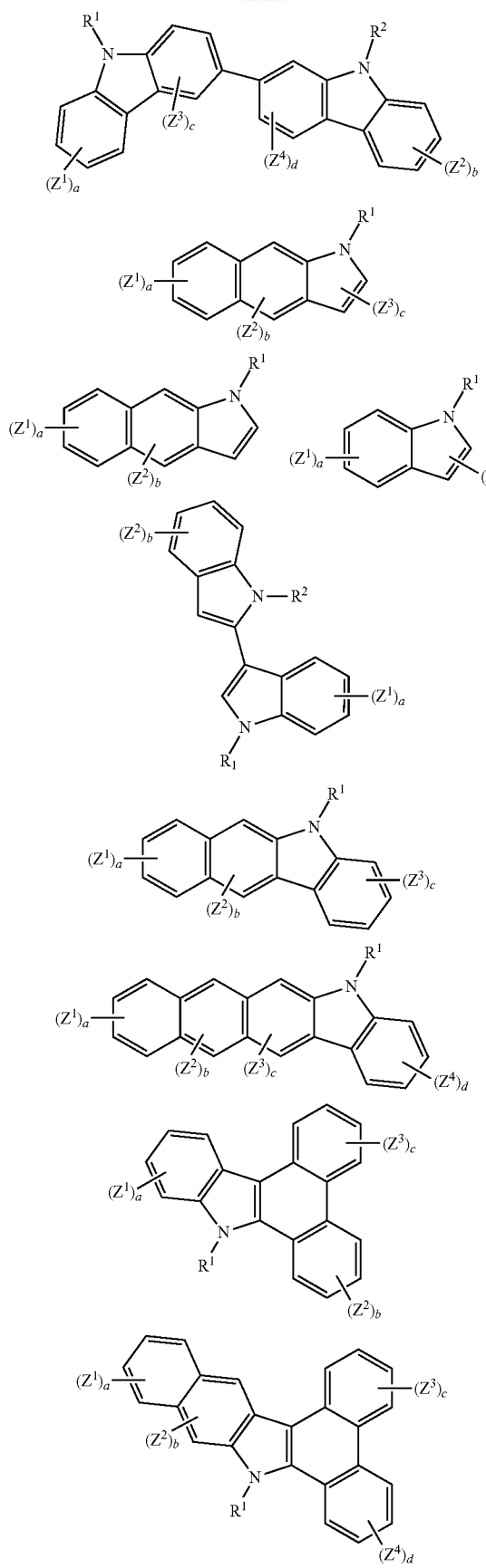
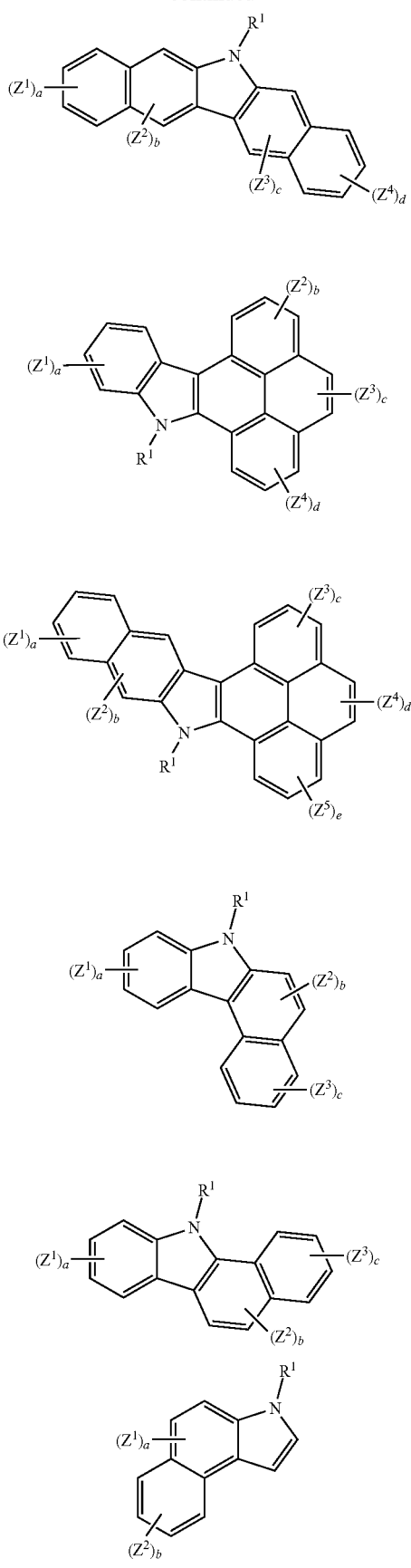

-continued

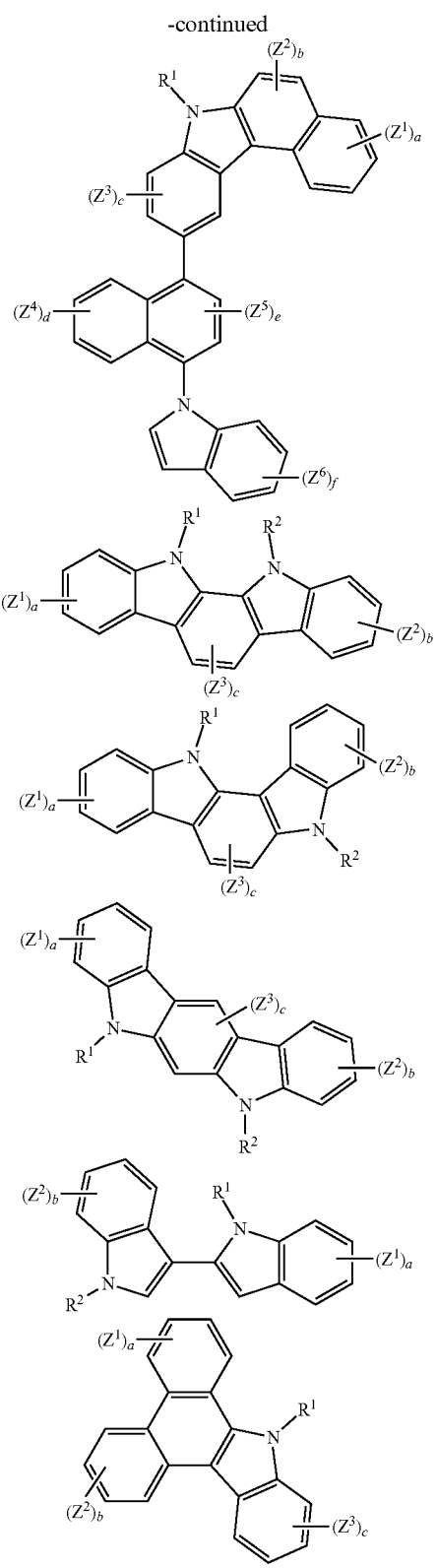

wherein, in the above moieties,

R$^1$, R$^2$ and R$^3$ are each independently hydrogen, a hydroxy group, a methoxy group, an ethoxy group, a halogen, a substituted or unsubstituted C6 to C30 aryl group, or a combination thereof, Z$^1$ to Z$^6$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, and a, b, c, d, e, and f are each independently an integer of 0 to 2, A$^3$ and A$^4$ are each independently a divalent group represented by Chemical Formula 2 or Chemical Formula 3, below,

[Chemical Formula 2]

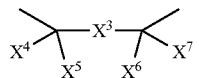

[Chemical Formula 3]

wherein, in Chemical Formula 2,

X$^1$ and X$^2$ are each independently hydrogen or a substituted or unsubstituted C6 to C30 aryl group, and at least one of X$^1$ and X$^2$ is a substituted or unsubstituted C6 to C30 aryl group, wherein, in Chemical Formula 3, X$^3$ is a substituted or unsubstituted C6 to C30 arylene group, and X$^4$ to X$^7$ are each independently a substituted or unsubstituted C6 to C30 aryl group, wherein, in Chemical Formula 1, when A$^1$ or A$^2$ is a divalent group including the moiety

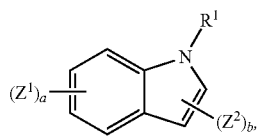

the divalent group is bonded to A$^3$ or A$^4$ at the nitrogen-containing ring of the moiety.

9. The organic layer composition as claimed in claim 8, wherein, in Chemical Formulae 2 and 3, the C6 to C30 aryl group is a monovalent group including one of the following moieties:

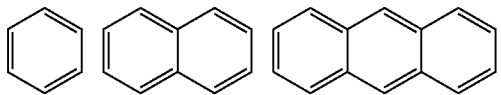

-continued
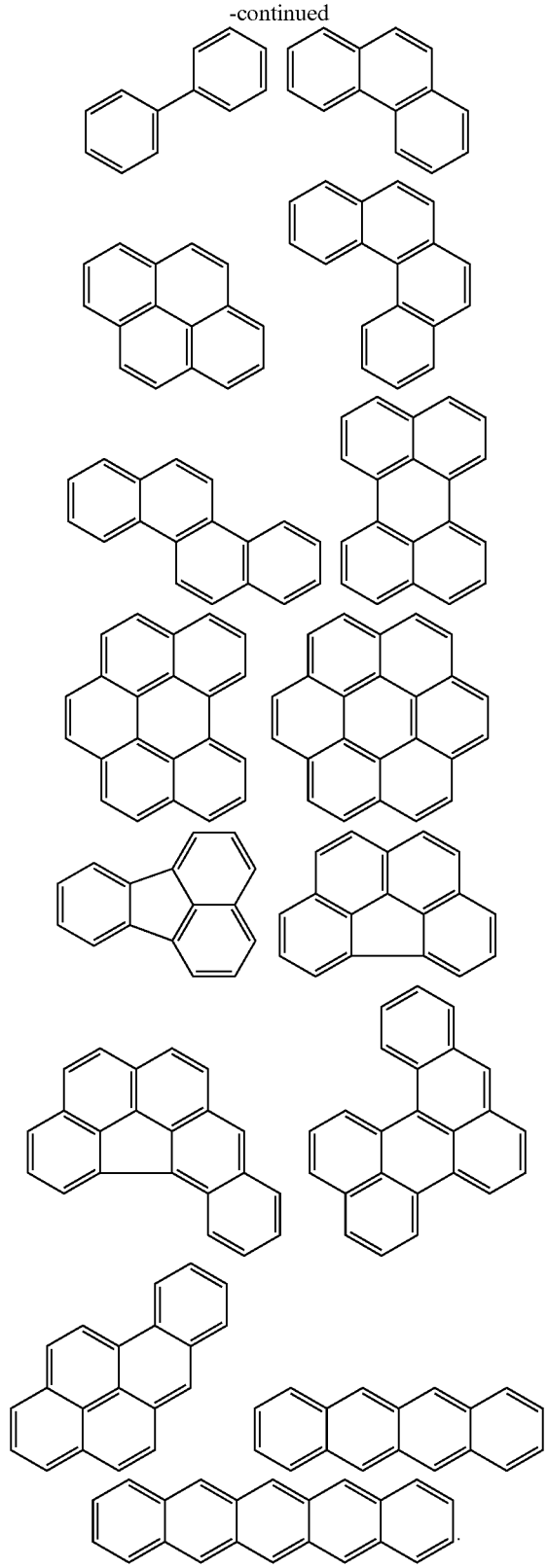
10. The organic layer composition as claimed in claim 8, wherein:
 one of $A^3$ or $A^4$ is a divalent group represented by Chemical Formula 3, and
in Chemical Formula 3, the C6 to C30 arylene group is a divalent group including one of the following moieties:
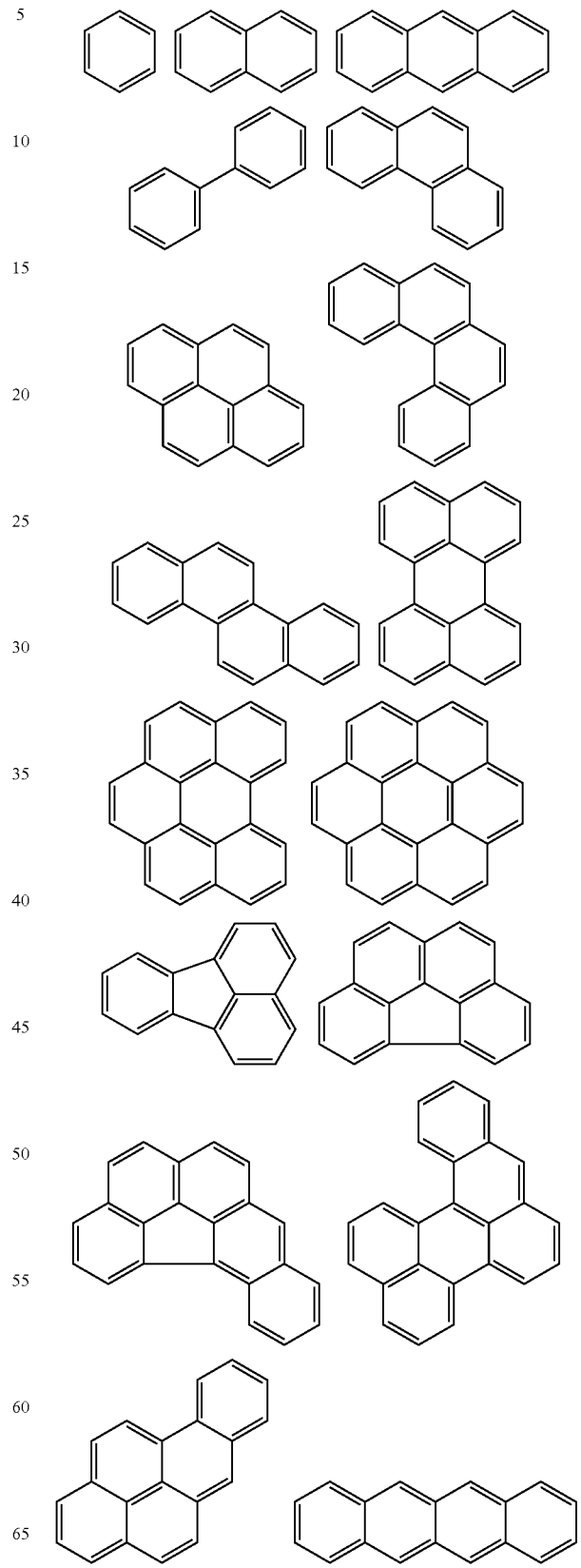

-continued

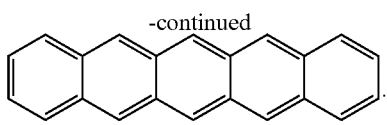

11. The organic layer composition as claimed in claim 8, wherein:
one of $A^3$ or $A^4$ is a divalent group represented by Chemical Formula 2, and
in Chemical Formula 2, at least one of $X^1$ and $X^2$ is a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof.

12. The organic layer composition as claimed in claim 8, wherein:
one of $A^3$ or $A^4$ is a divalent group represented by Chemical Formula 3, and
in Chemical Formula 3, at least one of $X^3$ to $X^7$ is a substituted or unsubstituted naphthalene group, a substituted or unsubstituted biphenyl group, a substituted or unsubstituted pyrene group, a substituted or unsubstituted perylene group, a substituted or unsubstituted benzoperylene group, a substituted or unsubstituted coronene group, or a combination thereof.

13. The organic layer composition as claimed in claim 8, wherein the polymer includes a moiety represented by one of the following Chemical Formulae 1-1 to 1-4:

[Chemical Formula 1-1]

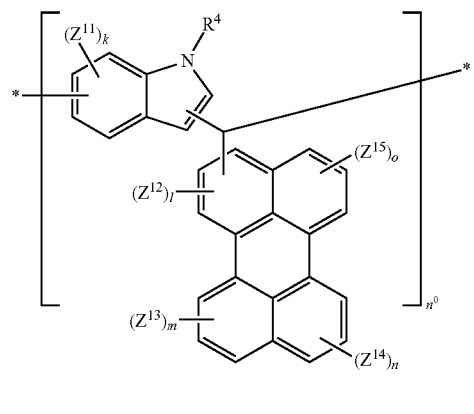

[Chemical Formula 1-2]

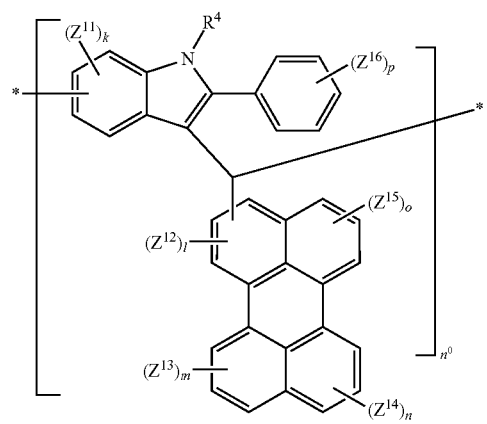

[Chemical Formula 1-3]

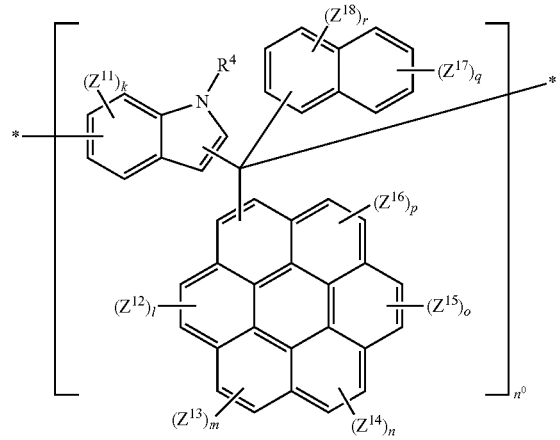

-continued

[Chemical Formula 1-4]

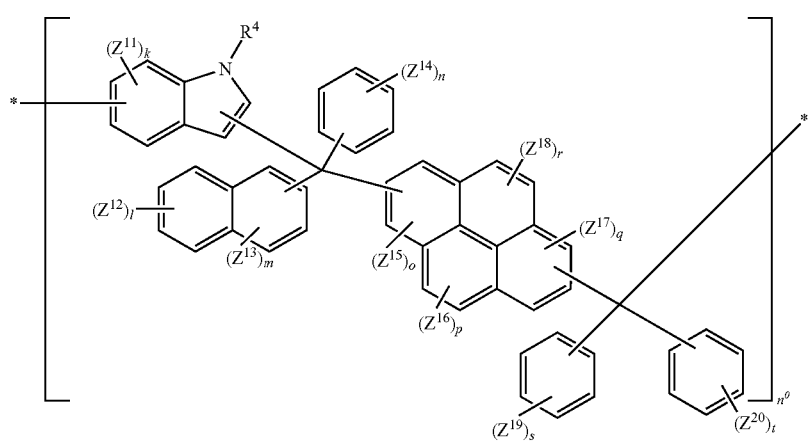

wherein, in Chemical Formulae 1-1 to 1-4, $R^4$ is hydrogen, a hydroxy group, a halogen, a substituted or unsubstituted C6 to C30 aryl group, or a combination thereof, $Z^{11}$ to $Z^{20}$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, k, l, m, n, o, p, q, r, s, and t are each independently an integer of 0 to 2, $n^o$ is an integer of 2 to 300, and

* is a linking point to a neighboring atom.

14. The organic layer composition as claimed in claim 8, wherein the polymer has a weight average molecular weight of about 1,000 to about 200,000.

15. The organic layer composition as claimed in claim 8, wherein the polymer is included in an amount of about 0.1 wt % to about 30 wt %, based on a total weight of the organic layer composition.

16. An organic layer obtained by curing the organic layer composition as claimed in claim 8.

17. The organic layer as claimed in claim 16, wherein the organic layer is a hard mask layer.

18. A method of forming patterns, the method comprising:
providing a material layer on a substrate,
applying the organic layer composition as claimed in claim 8 on the material layer,
heat-treating the organic layer composition to form a hardmask layer,
forming a silicon-containing thin layer on the hardmask layer,
forming a photoresist layer on the silicon-containing thin layer,
exposing and developing the photoresist layer to form a photoresist pattern;
selectively removing the silicon-containing thin layer and the hardmask layer using the photoresist pattern to expose a part of the material layer, and
etching an exposed part of the material layer.

19. The method as claimed in claim 18, wherein applying the organic layer composition includes performing a spin-on coating.

20. The method as claimed in claim 18, further comprising forming a bottom antireflective coating prior to forming the photoresist layer.

21. A polymer including a moiety represented by one of the following Chemical Formulae 1-1 to 1-4:

[Chemical Formula 1-1]

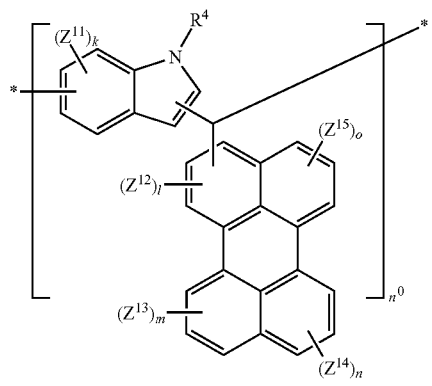

[Chemical Formula 1-2]

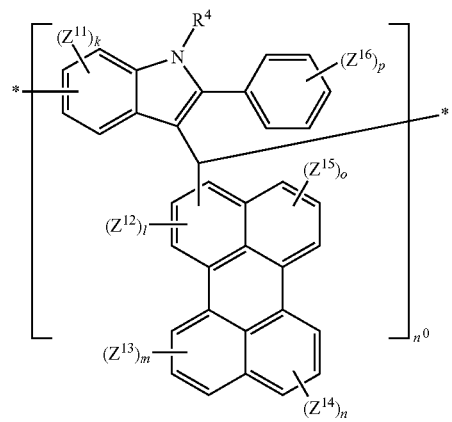

[Chemical Formula 1-3]

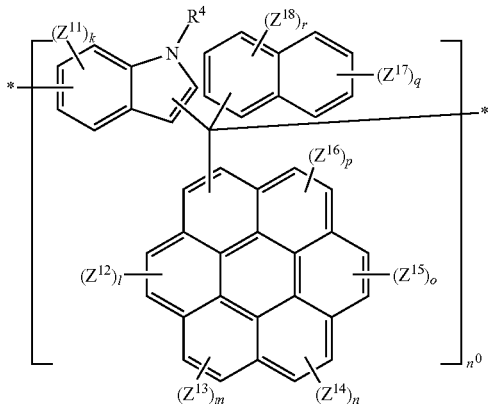

[Chemical Formula 1-4]

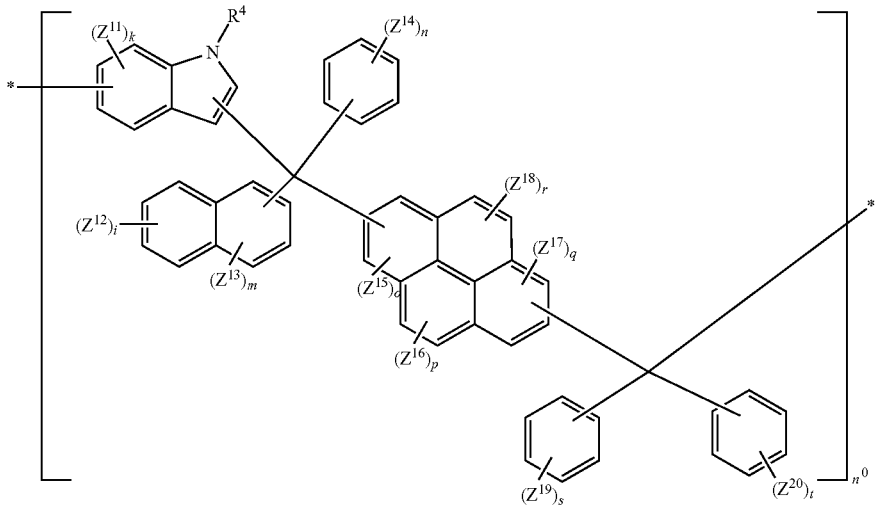

wherein, in Chemical Formulae 1-1 to 1-4, $R^4$ is hydrogen, a hydroxy group, a halogen, a substituted or unsubstituted C6 to C30 aryl group, or a combination thereof, $Z^{11}$ to $Z^{20}$ are each independently a hydroxy group, a methoxy group, an ethoxy group, a halogen, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, or a combination thereof, k, l, m, n, o, p, q, r, s, and t are each independently an integer of 0 to 2, $n^o$ is an integer of 2 to 300, and

* is a linking point to a neighboring atom.

22. An organic layer obtained by curing an organic layer composition, the organic layer composition including:
a solvent; and
the polymer as claimed in claim 21.

* * * * *